US011843903B2

(12) United States Patent
Mazed

(10) Patent No.: US 11,843,903 B2
(45) Date of Patent: *Dec. 12, 2023

(54) INTELLIGENT SUBSYSTEM IN A ACCESS NETWORKS

(71) Applicant: Mohammad A. Mazed, Yorba Linda, CA (US)

(72) Inventor: Mohammad A. Mazed, Yorba Linda, CA (US)

(*) Notice: Subject to any disclaimer, the term of this patent is extended or adjusted under 35 U.S.C. 154(b) by 193 days.

This patent is subject to a terminal disclaimer.

(21) Appl. No.: 17/300,394

(22) Filed: Jun. 15, 2021

(65) Prior Publication Data

US 2021/0360338 A1    Nov. 18, 2021

Related U.S. Application Data

(63) Continuation-in-part of application No. 16/974,218, filed on Nov. 16, 2020, now Pat. No. 11,178,474, and a continuation-in-part of application No. 16/873,634, filed on May 26, 2020, now Pat. No. 11,625,761, and a continuation-in-part of application No. 16/602,966, filed on Jan. 6, 2020, now Pat. No. 11,747,279, and a (Continued)

(51) Int. Cl.
| | |
|---|---|
| *H04B 10/27* | (2013.01) |
| *H04Q 11/00* | (2006.01) |
| *H04B 10/272* | (2013.01) |
| *H04J 14/02* | (2006.01) |
| *H01S 3/101* | (2006.01) |
| *H04B 10/516* | (2013.01) |
| *H01S 5/026* | (2006.01) |
| *H01S 5/0625* | (2006.01) |

(52) U.S. Cl.
CPC ........ *H04Q 11/0067* (2013.01); *H01S 3/101* (2013.01); *H04B 10/272* (2013.01); *H04B 10/5161* (2013.01); *H04J 14/0223* (2013.01); *H04J 14/0256* (2013.01); *H04J 14/0282* (2013.01); *H04Q 11/0005* (2013.01); *H01S 5/0265* (2013.01); *H01S 5/06256* (2013.01); *H01S 5/06258* (2013.01); *H04Q 2011/0016* (2013.01); *H04Q 2011/0032* (2013.01); *H04Q 2011/0064* (2013.01)

(58) Field of Classification Search
CPC ... H04B 10/272; H04B 10/5161; H04J 14/02; H04Q 11/0067
See application file for complete search history.

(56) References Cited

U.S. PATENT DOCUMENTS

| | | | |
|---|---|---|---|
| 11,320,588 B1 * | 5/2022 | Mazed | G16H 10/40 |
| 2006/0222364 A1 * | 10/2006 | Chung | H04J 14/0246 398/72 |

(Continued)

*Primary Examiner* — Dzung D Tran

(57) ABSTRACT

An intelligent subsystem coupled with a radio transceiver, a voice processing module, an intelligent (smart) camera, a first set of computer implementable instructions in an artificial intelligence algorithm and a fuzzy logic algorithm (stored in one or more non-transitory storage medias) and a second set of computer implementable instructions to provide a search on an internet in response to a user's interest/preference (stored in the one or more non-transitory storage medias), wherein the first set of computer implementable instructions and the second set of computer implementable instructions are combined/integrated or separated.

77 Claims, 13 Drawing Sheets

Related U.S. Application Data continuation-in-part of application No. 16/602,404, filed on Sep. 28, 2019, now Pat. No. 11,320,588, said application No. 16/974,218 is a continuation-in-part of application No. 16/602,095, filed on Aug. 5, 2019, now Pat. No. 10,638,208, which is a continuation of application No. 16/350,132, filed on Oct. 2, 2018, now Pat. No. 10,382,848, which is a continuation of application No. 15/731,313, filed on May 23, 2017, now Pat. No. 10,154,326, which is a continuation of application No. 14/999,984, filed on Jul. 25, 2016, now Pat. No. 9,723,388, which is a continuation of application No. 14/014,239, filed on Aug. 29, 2013, now Pat. No. 9,426,545, which is a continuation of application No. 12/931,384, filed on Jan. 31, 2011, now Pat. No. 8,548,334, which is a continuation-in-part of application No. 12/238,286, filed on Sep. 25, 2008, now abandoned, which is a continuation-in-part of application No. 11/952,001, filed on Dec. 6, 2007, now Pat. No. 8,073,331.

(60) Provisional application No. 61/404,504, filed on Oct. 5, 2010, provisional application No. 60/970,487, filed on Sep. 6, 2007, provisional application No. 60/883,727, filed on Jan. 5, 2007, provisional application No. 60/868,838, filed on Dec. 6, 2006.

(56) References Cited

U.S. PATENT DOCUMENTS

| | | | |
|---|---|---|---|
| 2008/0037990 A1* | 2/2008 | Effenberger | H04J 14/0252 398/67 |
| 2009/0096676 A1* | 4/2009 | Yan | H01Q 9/285 430/323 |
| 2010/0034535 A1* | 2/2010 | Guignard | H04Q 11/0067 398/168 |

* cited by examiner

INTELLIGENT SUBSYSTEM IN A ACCESS NETWORKS

CROSS REFERENCE TO RELATED APPLICATIONS

The present application is
a continuation-in-part (CIP) patent application of (a) U.S. Non-Provisional patent application Ser. No. 16/974,218 entitled "Intelligent Subsystem In Access Networks", filed on Nov. 16, 2020,
wherein (a) is a continuation patent application of (b) U.S. non-provisional patent application Ser. No. 16/602,095 entitled "Intelligent Subsystem In Access Networks", filed on Aug. 5, 2019,
wherein (b) is a continuation patent application of (c) U.S. non-provisional patent application Ser. No. 16/350,132 entitled "Intelligent Subsystem in Access Networks", filed on Oct. 2, 2018,
wherein (c) is a continuation patent application of (d) U.S. non-provisional patent application Ser. No. 15/731,313 entitled "Access Communication System With Object/Intelligent Appliance-To-Object/Intelligent Appliance Interaction", filed on May 23, 2017, (which resulted in a U.S. Pat. No. 10,154,326, issued on Dec. 11, 2018),
wherein (d) is a continuation patent application of (e) U.S. non-provisional patent application Ser. No. 14/999,984 entitled "Dynamic Intelligent Bidirectional Optical Access Communication System With Object/Intelligent Appliance-To-Object/Intelligent Appliance Interaction", filed on Jul. 25, 2016, (which resulted in a U.S. Pat. No. 9,723,388, issued on Aug. 1, 2017),
wherein (e) is a continuation patent application of (f) U.S. non-provisional patent application Ser. No. 14/014,239 entitled "Dynamic Intelligent Bidirectional Optical Access Communication System With Object/Intelligent Appliance-To-Object/Intelligent Appliance Interaction", filed on Aug. 29, 2013, (which resulted in a U.S. Pat. No. 9,426,545, issued on Aug. 23, 2016),
wherein (f) is a continuation patent application of (g) U.S. non-provisional patent application Ser. No. 12/931,384 entitled "Dynamic Intelligent Bidirectional Optical Access Communication System With Object/Intelligent Appliance-To-Object/Intelligent Appliance Interaction", filed on Jan. 31, 2011, (which resulted in a U.S. Pat. No. 8,548,334, issued on Oct. 1, 2013),
wherein (g) claims the benefit of priority to (h) U.S. provisional application Ser. No. 61/404,504 entitled "Dynamic Intelligent Bidirectional Optical Access Communication System With Object/Intelligent Appliance-To-Object/Intelligent Appliance Interaction", filed on Oct. 5, 2010,
wherein (g) is a continuation-in-part (CIP) of (i) U.S. non-provisional patent application Ser. No. 12/238,286 entitled "Portable Internet Appliance", filed on Sep. 25, 2008, and
wherein (i) is a continuation-in-part (CIP) of (j) U.S. non-provisional patent application Ser. No. 11/952,001, entitled "Dynamic Intelligent Bidirectional Optical and Wireless Access Communication System, filed on Dec. 6, 2007, (which resulted in a U.S. Pat. No. 8,073,331, issued on Dec. 6, 2011),
wherein (j) claims the benefit of priority to
(k) U.S. provisional patent application Ser. No. 60/970,487 entitled "Intelligent Internet Device", filed on Sep. 6, 2007,
(l) U.S. provisional patent application Ser. No. 60/883,727 entitled "Wavelength Shifted Dynamic Bidirectional System", filed on Jan. 5, 2007,
(m) U.S. provisional patent application Ser. No. 60/868,838 entitled "Wavelength Shifted Dynamic Bidirectional System", filed on Dec. 6, 2006.

The entire contents of all (i) U.S. Non-Provisional patent applications, (ii) U.S. Provisional patent applications, as listed in the previous paragraph and (iii) the filed (patent) Application Data Sheet (ADS) are hereby incorporated by reference, as if they are reproduced herein in their entirety.

FIELD OF THE INVENTION

Bandwidth demand and total deployment cost (capital cost and operational cost) of an advanced optical access communication system are increasing, while a return on investment (ROI) is decreasing. This has created a significant business dilemma.

More than ever before, we have become more mobile and global. Intelligent pervasive and always-on internet access via convergence of all (e.g., an electrical/optical/radio/electromagnetic/sensor/biosensor) communication networks can provide connectivity at anytime, from anywhere, to anything is desired.

The present invention is related to a dynamic bidirectional optical access communication system with an intelligent subscriber subsystem that can connect/couple/interact (via one/more/all the networks as listed hereinafter: electrical/optical/radio/electromagnetic/sensor/biosensor communication network(s)) with an object and an intelligent appliance, utilizing internet protocol version 6 (IPv6) and its subsequent versions.

An intelligent subscriber system and/or an object and/or an intelligent appliance includes one/more of the following: (a) modules (wherein a module is defined as a functional integration of critical electrical/optical/radio/sensor components, circuits and algorithms needed to achieve a desired function/property of a module): a laser, a photodiode, a modulator, a demodulator, a phase-to-intensity converter, an amplifier, a wavelength combiner/decombiner, an optical power combiner/decombiner, a cyclic arrayed waveguide router, a micro-electrical-mechanical-system (MEMS) space switch, an optical switch, an optical circulator, an optical filter, an optical intensity attenuator, a processor, a memory, a display component, a microphone, a camera, a sensor, a biosensor, a radio, a near-field-communication (NFC), a scanner, a power source, (b) an embedded and/or a cloud based operating system software module (wherein a software module is defined as a functional integration of critical algorithms needed to achieve a desired function/property of a software module) and/or (c) an embedded and/or a cloud based intelligence rendering software module.

Furthermore, an object can sense/measure/collect/aggregate/compare/map and connect/couple/interact (via one/more/all the networks as listed hereinafter: electrical/optical/radio/electromagnetic/sensor/biosensor communication network(s)) with another object, an intelligent subscriber subsystem and an intelligent appliance, utilizing internet protocol version 6 (IPv6) and its subsequent versions.

SUMMARY OF THE INVENTION

A dynamic intelligent bidirectional optical access communication system utilizes two critical optical modules: a phase modulator and an intensity modulator at an intelligent subscriber subsystem. Together, these two critical optical modules can reduce the Rayleigh backscattering effect on the propagation of optical signals.

The reduced Rayleigh backscattering effect can enable a longer-reach optical access communication network (longer-reach than a currently deployed optical access communication network) between an intelligent subscriber subsystem and a super node (e.g., many neighboring nodes collapsed into a preferred super node). Such a longer-reach optical access communication network can eliminate significant costs related to a vast array of middle equipment (e.g., a router/switch), which otherwise would be needed between a standard node (without a super node configuration) and a large number of remote nodes, according to a currently deployed optical access communication network.

In one embodiment of the present invention, a bidirectional optical access communication system can be configured to be capable of a longer-reach optical access communication network.

In another embodiment of the present invention, a bidirectional optical access communication system can be configured to be capable of dynamically providing wavelength on-Demand and/or bandwidth on-Demand and/or service on-Demand.

In another embodiment of the present invention, fabrication and construction of a wavelength tunable laser component/module is described.

In another embodiment of the present invention, an optical signal can be routed to an intended destination securely by extracting an intended destination from a destination marker optical signal.

In another embodiment of the present invention, fabrication, construction and applications of an object are described.

In another embodiment of the present invention, an object can sense/measure/collect/aggregate/compare/map and connect/couple/interact (via one/more/all the networks as listed hereinafter: electrical/optical/radio/electromagnetic/sensor/biosensor communication network(s)) with another object, an intelligent subscriber subsystem and an intelligent appliance, utilizing internet protocol version 6 (IPv6) and its subsequent versions.

In another embodiment of the present invention, an intelligence rendering software module allows a subscriber subsystem to adapt/learn/relearn a user's interests/preferences/patterns, thereby rendering intelligence to a subscriber subsystem.

In another embodiment of the present invention, an intelligence rendering software module allows an appliance to adapt/learn/relearn a user's interests/preferences/patterns, thereby rendering intelligence to an appliance.

In another embodiment of the present invention, fabrication and construction of a near-field communication enabled micro-subsystem/intelligent appliance is described.

In another embodiment of the present invention, a portfolio of applications (e.g., an intelligent, location based and personalized social network and direct/peer-to-peer marketing) is also described.

The present invention can be better understood in the description below with accompanying drawings.

DETAILED DESCRIPTION OF THE PREFERRED EMBODIMENTS

Figure 1:
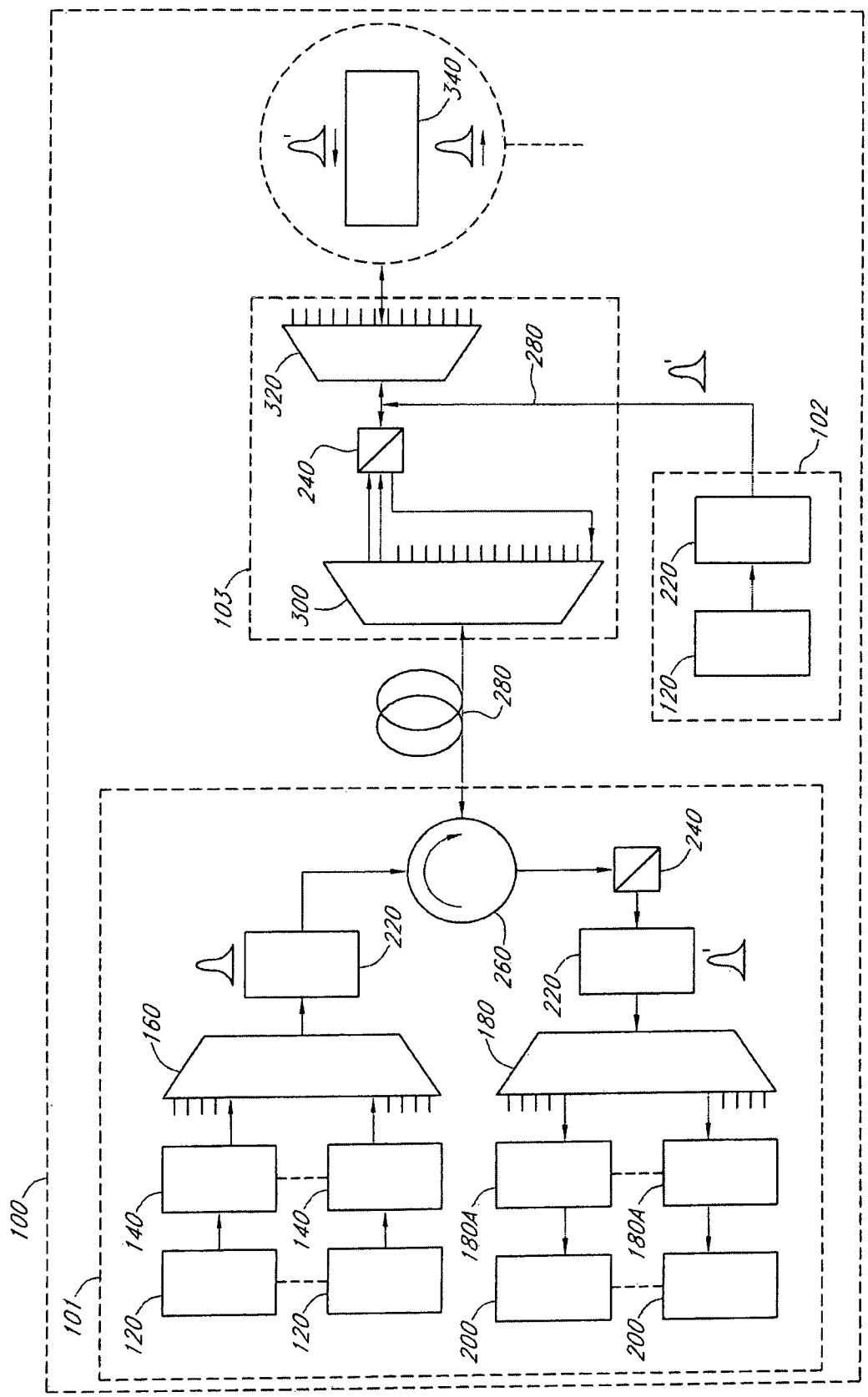
FIG. 1 illustrates a block diagram configuration of a bidirectional optical access communication network 100, according to one embodiment of the present invention.

FIG. 1 illustrates a block diagram configuration of a bidirectional optical access communication network 100, which includes a super node 101, many distant local nodes 102 and many distant remote nodes 103. The distance between the super node 101 and the remote node 103 is greater than the distance between the super node 101 and the local node 102. However, many local nodes 102 can collapse/reside within the super node 101 to enable a bidirectional optical access communication network 100, without a roadside electrical power requirement at the local node 102.

A bidirectional optical access communication network 100 is connected/coupled/interacted with the super node 101, many local nodes 102, many remote nodes 103 and a large number of intelligent subscriber subsystems 340s (located at homes/businesses) over a dispersion-compensated single-mode optical fiber 280. At the super node 101, a number of laser modules (high power fast wavelength switching-wavelength tunable semiconductor laser modules are preferred) 120s provide a first set of downstream wavelengths, where each downstream wavelength is modulated at 10 Gb/s or higher Gb/s, by a corresponding intensity modulator module (an electro-absorption/Mach-Zehnder intensity modulator module is preferred) 140 to provide optical signals. These modulated downstream wavelengths (embedded with the optical signals) are combined by a wavelength combiner module 160 and amplified by an erbium-doped fiber amplifier (EDFA) module 220. These amplified downstream wavelengths are passed through a 3-port circulator module 260 and transmitted over the dispersion-compensated single-mode optical fiber (with a distributed Raman amplifier is preferred) 280 to the remote node 103. A distributed Raman amplifier can provide distributed amplification of the optical signal over the dispersion-compensated single-mode optical fiber 280 by nonlinear coupling/interaction between the optical signal and an optical pump signal, thereby effectively increasing the reach of an optical access communication network more than a currently deployed optical access communication network. At the remote node 103, the modulated downstream wavelengths from the super node 101, are decombined by an integrated wavelength combiner/decombiner module 300, filtered by a bandpass optical filter module (a wavelength switching-wavelength tunable bandpass optical filter module is preferred) 240, are power split by an integrated optical power combiner/decombiner module 320 and are transmitted to a number of intelligent subscriber subsystems 340s. However, all the optical modules at the remote node 103 must be temperature insensitive to operate within a wide temperature range at the remote node 103, as there may not be an option of an electrical power at the remote node 103. The downstream wavelengths from the super node 101 to the number of intelligent subscriber subsystems 340s can be transmitted and correspondingly received by photodiode modules 200s at the intelligent subscriber subsystems 340s, utilizing a time division multiplexed statistical bandwidth allocation and/or a broadcasting method.

The local node 102 includes the laser module 120, which is connected/coupled/interacted with the erbium-doped fiber amplifier (EDFA) module 220 to provide an upstream wavelength from the intelligent subscriber subsystems 340s, which is offset in wavelength with respect to the first set of downstream wavelengths generated at the super node 101. The upstream wavelength power splits through the integrated optical power combiner/decombiner module 320 at the remote node 103 and is transmitted to the number of intelligent subscriber subsystems 340s for further optical processing by an optical processing micro-subsystem 360. An optically processed upstream wavelength (embedded with the optical signals) by the optical processing micro-subsystem 360 (within the intelligent subscriber subsystem 340) is looped/returned back through the integrated optical power combiner/decombiner module 320, the bandpass optical filter module 240 and the integrated wavelength combiner/decombiner module 300 at the remote node 103. The optically processed upstream wavelength is transmitted over the dispersion-compensated single-mode optical fiber 280 and passed through the 3-port circulator module 260 at the super node 101. The 3-port circulator module 260 provides the upstream wavelengths from a number of intelligent subscriber subsystems 340s to the bandpass optical filter 240, the erbium-doped fiber amplifier (EDFA) module 220, the wavelength decombiner module 180, a number of external fiber-optic interferometer modules 180As (to convert a phase modulation signal into an intensity modulation signal) and the photodiode modules 200s at the super node 101, wherein each photodiode module 200 is detecting the distinct upstream wavelength. Furthermore, each photodiode module 200 includes one or more of the following optical/electronic components: a 10 Gb/s or higher Gb/s linear photodiode chip, a 10 Gb/s or higher Gb/s mesa-type/waveguide-type avalanche photodiode chip (APD), a 10 Gb/s or higher Gb/s burst-mode transimpedance amplifier, a 10 Gb/s or higher Gb/s clock and data recovery (CDR), the bandpass optical filter 240 and a semiconductor optical amplifier 380 (if the semiconductor optical amplifier 380 is needed for optical gain in conjunction with a 10 Gb/s or higher Gb/s linear photodiode chip). The upstream wavelength from a number of intelligent subscriber subsystems 340s to the super node 101 can be transmitted and correspondingly received by the photodiode modules 200s at the super node 101, utilizing a time division multiplexed statistical bandwidth allocation and/or a broadcasting method.

Figure 2:
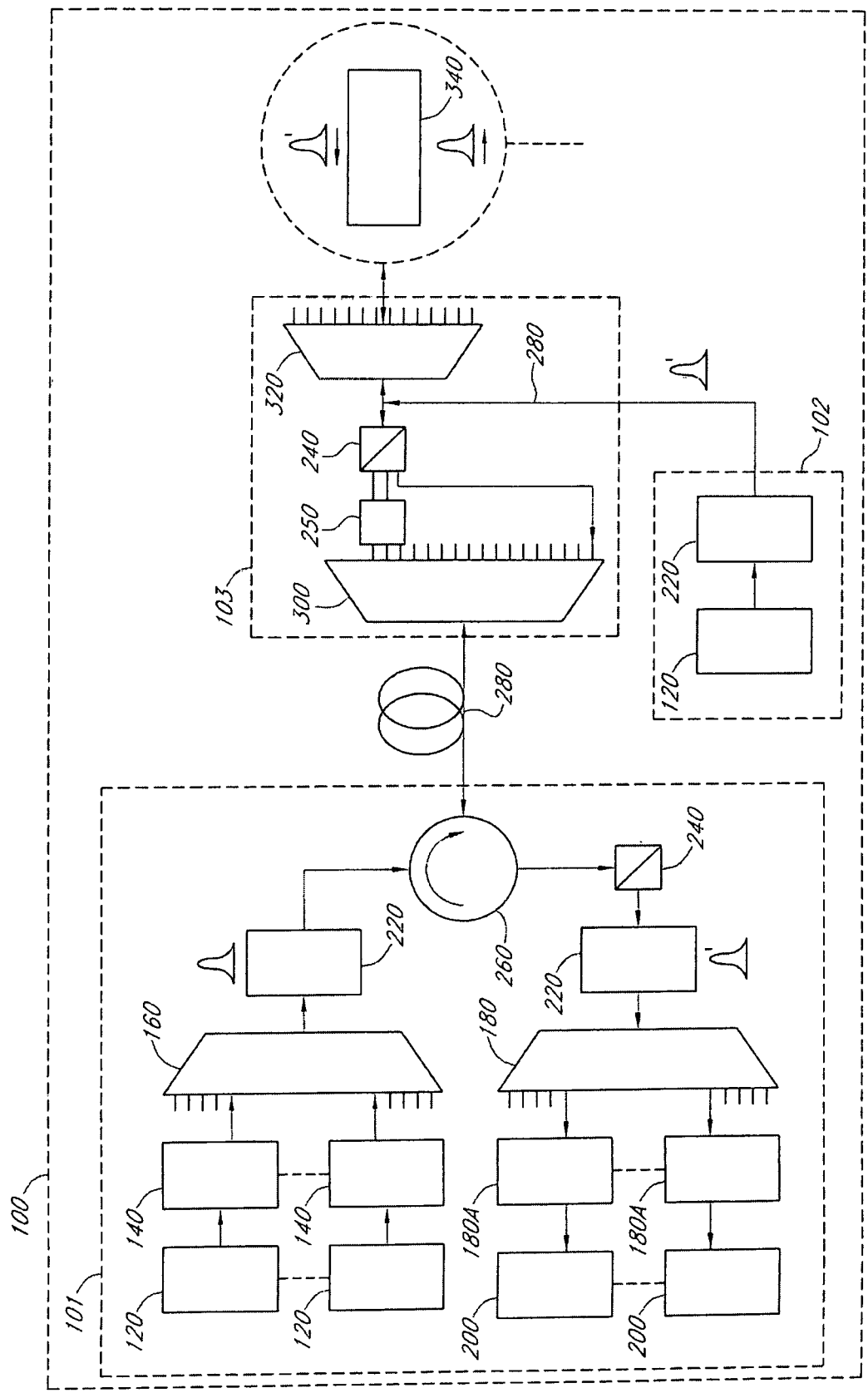
FIG. 2 illustrates a block diagram configuration of a dynamic bidirectional optical access communication network 100, according to another embodiment of the present invention.

FIG. 2 illustrates a block diagram configuration of a dynamic bidirectional optical access communication network 100, where any wavelength to the intelligent subscriber subsystem 340 can be dynamically varied on-Demand by utilizing an M:M cyclic wavelength arrayed waveguide grating router module (a fast wavelength switching-wavelength tunable programmable M:M cyclic wavelength arrayed waveguide grating router module is preferred) 250 at the remote node 103. All possible switched output downstream wavelengths are arranged at the M outputs of the M:M cyclic wavelength arrayed waveguide grating router module 250 because of the free spectral range periodic property of the M:M cyclic wavelength arrayed waveguide grating router module. This configuration offers the flexibility of dynamically routing/delivering one or more downstream wavelengths with different modulation rates (e.g., 10 Gb/s or higher Gb/s) provided by the corresponding intensity modulator module 140, to the intelligent subscriber subsystem 340 for wavelength on-Demand, bandwidth on-Demand and service on-Demand, significantly increasing a return on investment. Thus, each dynamically routed wavelength with a specific modulation rate can provide a distinct bandwidth-specific service on-Demand (e.g., an ultra-high definition movie on-Demand) to the specific intelligent subscriber subsystem 340.

A method of providing bandwidth-specific service on-Demand can be realized by including at least the steps: (a) the user requesting a specific service (e.g., an ultra-high definition movie on-Demand) at the specific intelligent subscriber subsystem 340, (b) delivering the specific service over a wavelength by the laser module 120 from the super node 101, (c) modulating the wavelength at a required modulation rate (e.g., 10 Gb/s or higher Gb/s) by the intensity modulator module 140 at the super node 101 and (d) then dynamically routing the said wavelength (embedded with the user requested specific service) by the M:M cyclic wavelength arrayed waveguide grating router module 250 at the remote node 103 and to the specific intelligent subscriber subsystem 340.

Furthermore, rapid wavelength routing (in space, wavelength and time) by the M:M cyclic wavelength arrayed waveguide grating router module 250 can be fabricated/constructed as an optical packet/interconnect router between many printed circuit boards/integrated circuits/processors.

Additionally, outputs of the M:M cyclic wavelength arrayed waveguide grating router module 250 at the remote node 103 can be connected/coupled/interacted with inputs of a large-scale N:N (e.g., a 1000:1000) micro-electrical-mechanical-system space switch module at the remote node 103 to provide much greater flexibility of wavelength routing.

An input-output echelle grating module and/or a negative-index photonic crystal super-prism module can be utilized as alternatives to the wavelength combiner module 160, the wavelength decombiner module 180 and the integrated wavelength combiner/decombiner module 300. A multimode interference (MMI) module and/or a Y-combiner module can be utilized as alternatives to the integrated optical power combiner/decombiner module 320 and the optical power combiner module 320A.

Figure 3:
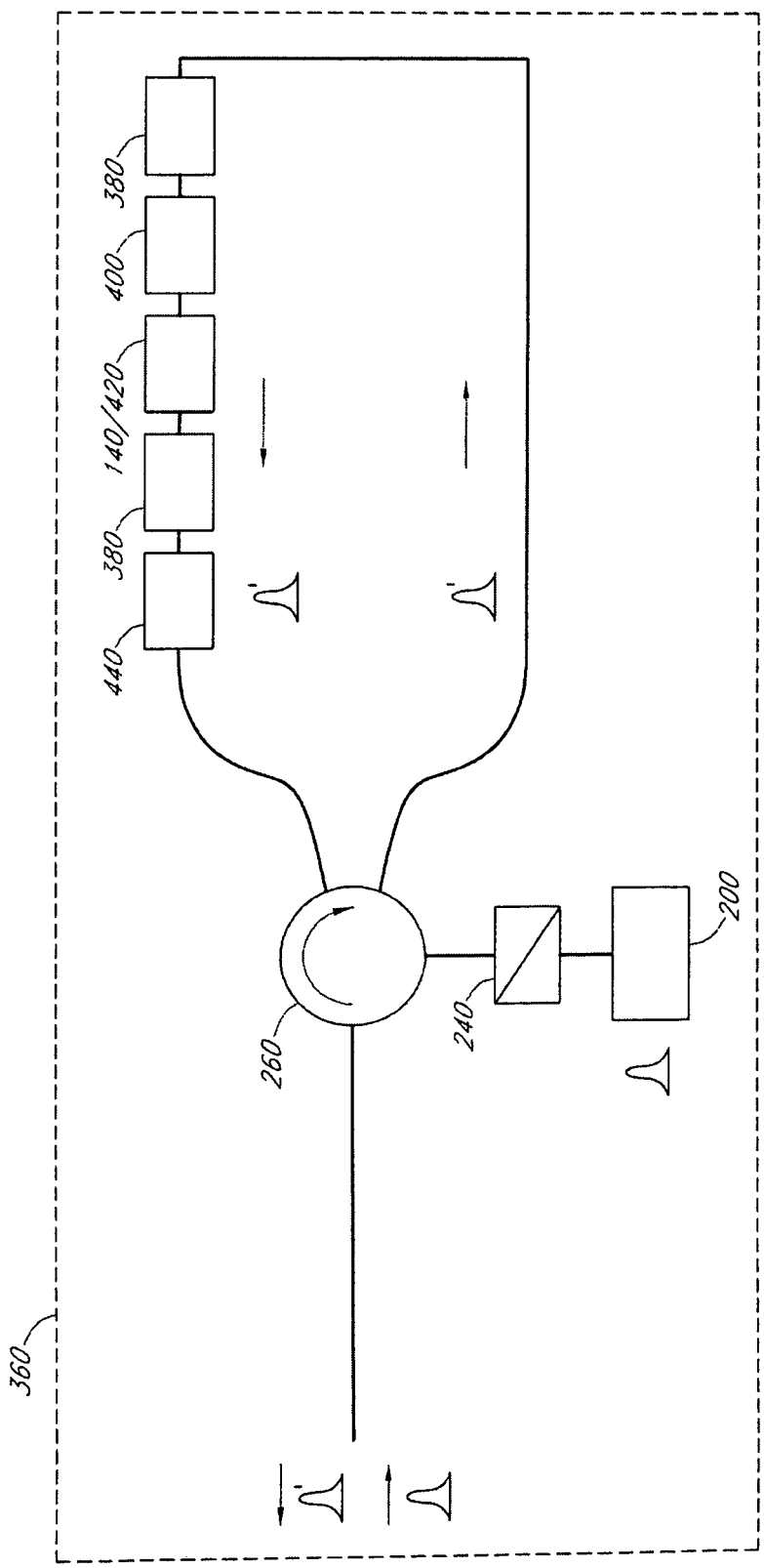
FIG. 3 illustrates a block diagram fabrication and construction of an optical processing micro-subsystem 360 (within an intelligent subscriber subsystem), according to another embodiment of the present invention.

FIG. 3 illustrates a block diagram construction of the optical processing micro-subsystem 360, wherein a downstream wavelength is passed through the 3-port circulator 260, the bandpass optical filter module 240 and the photodiode module 200. A wavelength from the laser module 120 at the local node 102 is passed through the 3-port circulator module 260 within the optical processing micro-subsystem 360 and this wavelength is amplified by the semiconductor optical amplifier module 380, modulated in phase by a phase modulator module 400, modulated at a bit-rate (e.g., 10 Gb/s or higher Gb/s, but a variable modulation bit-rate is preferred) in intensity by an intensity modulator module 420, amplified by the semiconductor optical amplifier module 380, transmitted through a variable optical intensity attenuator module 440 (if needed) and looped/returned back to create the upstream wavelength (embedded with an optical signal from the intelligent subscriber subsystem 340) and transmitted to the super node 101.

Furthermore, the generic intensity modulator module 140 can be replaced by an electro-absorption intensity modulator module 420, which is designed for integration with the semiconductor optical amplifier module 380, the phase modulator module 400 and the variable optical intensity attenuator module 440 on a monolithic photonic integrated circuit (PIC) and/or an active-passive hybrid planar lightwave circuit (PLC) technology.

Numerous permutations (e.g., modulating a CW optical signal from the laser module 120 at the local node 102 by the intensity modulator 140/420 and then by the phase modulator 400) of all optical modules within the optical processing micro-subsystem 360 are possible to create optimum quality of the upstream wavelength for an intended reach. Use of the phase modulator module 400 and the intensity modulator module 420 together can reduce the Rayleigh backscattering effect on the propagation of optical signals, enabling a longer-reach optical access communication network between the super node 101 and the remote node 103, thus eliminating a vast array of middle equipment such as routers and switches, which would otherwise be needed between a standard node (without the super node configuration) and a large number of the remote nodes 103s, according to a currently deployed optical access communication network.

According to another embodiment of the present invention, an upstream second set of wavelengths (which are offset in wavelengths with respect to the first set of wavelengths transmitted from the super node 101) can be internally generated by a wavelength tunable laser module within the intelligent subscriber subsystem 340, without the need for external wavelength generation by the laser module 120 at the local node 102. Generation of the upstream wavelength (fast switching-widely tunable laser module is preferred) within the intelligent subscriber subsystem 340 simplifies fabrication and construction of a dynamic bidirectional optical access communication network 100.

According to another embodiment of the present invention, a single-mode/mode-hopp free wavelength tunable (about 32 nm) laser module can be constructed by utilizing an ultra-low anti-reflection coated (both facets) semiconductor optical amplifier (a quantum dot semiconductor optical amplifier is preferred) and a triple-ring resonator waveguide on a planar lightwave circuit platform. The front facet of the triple-ring resonator waveguide has an ultra-low anti-reflection coating, while the back facet of that has a high-reflection coating. The anti-reflection coated back facet of the semiconductor optical amplifier and the anti-reflection coated front facet of the triple-ring resonator waveguide are intimately attached ("butt-coupled") to each other. The phases of a triple-ring resonator waveguide can be controlled by a metal strip heater along a straight segment of the triple-ring resonator waveguide. Furthermore, the semiconductor optical amplifier 380 can be monolithically integrated with the electro-absorption (EAM)/Mach-Zehnder intensity modulator.

Figure 3A:
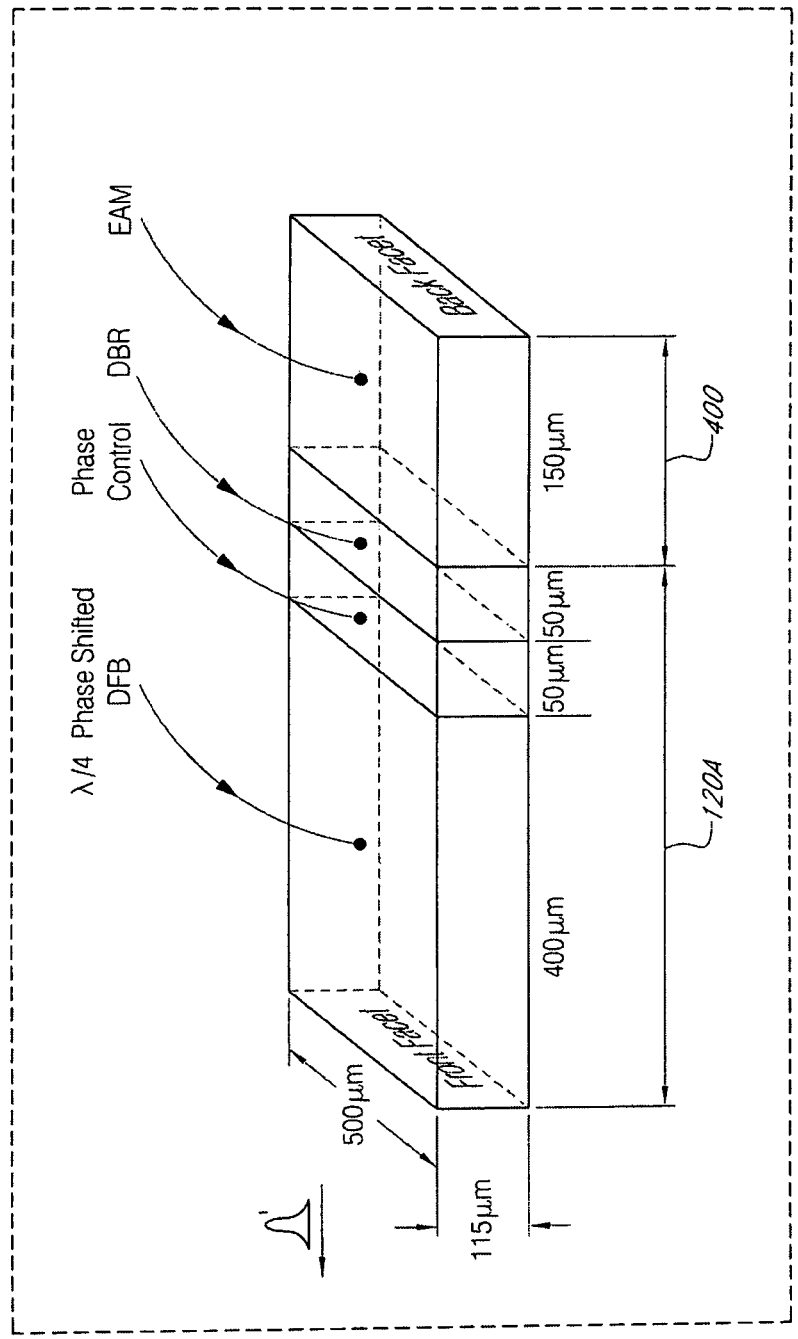
FIG. 3A illustrates a block diagram fabrication and construction of a wavelength tunable (narrowly) laser component, according to another embodiment of the present invention.

FIG. 3A illustrates a block diagram fabrication and construction of a single-mode/mode-hopp free wavelength tunable (narrow) laser component, including an electro-absorption modulator segment 400 (about 150 microns long), which can be integrated ("butt-coupled") with the back facet of a λ/4 phase shifted DR laser (λ/4 phase shifted distributed feedback (DFB) section (about 400 microns long)+phase control section (without any gratings/about 50 microns long)+distributed Bragg reflector (DBR) section (about 50 microns long)) 120A. Laser multi-quantum-well (MQW) layers can be stacked on top of electro-absorption intensity modulator multi-quantum-well layers. An electro-absorption intensity modulator can be processed by etching away the laser multi-quantum-well layers. Higher laser output (exit power) can be achieved by incorporating distributed phase shifts and/or chirped grating across the length of a distributed feedback section. An injection current to a phase control section can produce a change in distributed feedback laser wavelength. Reverse-voltage to the electro-absorption intensity modulator 420 can change in a refractive index by Quantum Confined Stark Effect (QCSE). The advantages of this tunable laser design are (1) high single-mode stability due to a distributed feedback section, (2) higher output (exit) power due to a distributed Bragg reflector section and (3) rapid wavelength tuning by an injection current to a phase control section and/or reverse voltage to the electro-absorption intensity modulator 420.

A stacked multi-quantum well cross-sectional layer design of the electro-absorption modulator with the DR laser is illustrated in Table I below.

TABLE 1

| | Thickness (nm) | N—/P— Doping ($10^{18}/cm^3$) | Composition $In_{(1-x)}Ga_{(x)}As_{(y)}P_{(1-y)}$ | Bandgap Wavelength (nm) | Strain (%) | Material Index |
|---|---|---|---|---|---|---|
| Substrate | $100 \times 10^3$ | N 3.0 | X = 0.000<br>Y = 0.000 | 918.6 | 0 | 3.1694 |
| Buffer | $1 \times 10^3$ | N 1.0 | X = 0.000<br>Y = 0.000 | 918.6 | 0 | 3.1694 |

TABLE 1-continued

| | Thickness (nm) | N—/P— Doping (10^18/cm^3) | Composition In(1-x)Ga(x)As(y)P(1-y) | Bandgap Wavelength (nm) | Strain (%) | Material Index |
|---|---|---|---|---|---|---|
| 1.15Q | 70 | N 0.5 | X = 0.181<br>Y = 0.395 | 1150 | 0 | 3.3069 |
| 1.20Q | 50 | N 0.5 | X = 0.216<br>Y = 0.469 | 1200 | 0 | 3.3345 |
| 1.10Q | 10 | N 0.001 | X = 0.145<br>Y = 0.317 | 1100 | 0 | 3.2784 |
| EAM Well-1 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-2 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-3 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-4 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-5 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-6 | 8 | N 0.001 | X = 0.463<br>Y = 0.930 | 1550 | TS0.2 | 3.5533 |
| 1.10Q | 10 | N 0.001 | X = 0.145<br>Y = 0.317 | 1100 | 0 | 3.2784 |
| Stop-Etch | 50 | N 0.001 | X = 0.000<br>Y = 0.000 | 918.6 | 0 | 3.1694 |
| *1.25Q | 10 | N 0.001 | X = 0.239<br>Y = 0.533 | 1250 | 0 | 3.3588 |
| *DR Well-1 | 5 | N 0.001 | X = 0.239<br>Y = 0.839 | 1642 | CS1.05 | 3.4971 |
| *1.25Q | 10 | N 0.001 | X = 0.239<br>Y = 0.533 | 1250 | 0 | 3.3588 |
| *DR Well-2 | 6 | N 0.001 | X = 0.239<br>Y = 0.839 | 1642 | CS1.05 | 3.4971 |
| *1.25Q | 10 | N 0.001 | X = 0.239<br>Y = 0.533 | 1250 | 0 | 3.3588 |
| *DR Well-3 | 5 | N 0.001 | X = 0.239<br>Y = 0.839 | 1642 | CS1.05 | 3.4971 |
| *1.25Q | 10 | N 0.001 | X = 0.239<br>Y = 0.533 | 1250 | 0 | 3.3588 |
| *DR Well-4 | 6 | N 0.001 | X = 0.239<br>Y = 0.839 | 1642 | CS1.05 | 3.4971 |
| *1.25Q | 10 | N 0.001 | X = 0.239<br>Y = 0.533 | 1250 | 0 | 3.3588 |
| *1.20Q | 50 | P 0.2 | X = 0.216<br>Y = 0.469 | 1200 | 0 | 3.3345 |
| **Grating: 1.15Q | 50 | P 0.2 | X = 0.181<br>Y = 0.395 | 1150 | 0 | 3.3069 |
| Cladding | 1.5 × 10^3 | P 0.2~P2.0 | X = 0.000<br>Y = 0.000 | 918.6 | 0 | 3.1694 |
| 1.30Q | 50 | P 5.0 | X = 0.280<br>Y = 0.606 | 1300 | 0 | 3.3871 |
| Cap | 200 | P 30 | X = 0.468<br>Y = 1.000 | 1654 | 0 | 3.5610 |

EAM: Electro-absorption modulator
DR: Laser
TS: Tensile
CS: Compressive
*These laser layers must be removed in EAM section and be replaced/re-grown with InP layer of total thickness of ~172 nm.
**λ/4 phase shifted gratings (at the DFB section of DR laser) are fabricated on this layer with 50% duty cycle at 40 nm grating etch depth.

Figure 3B:
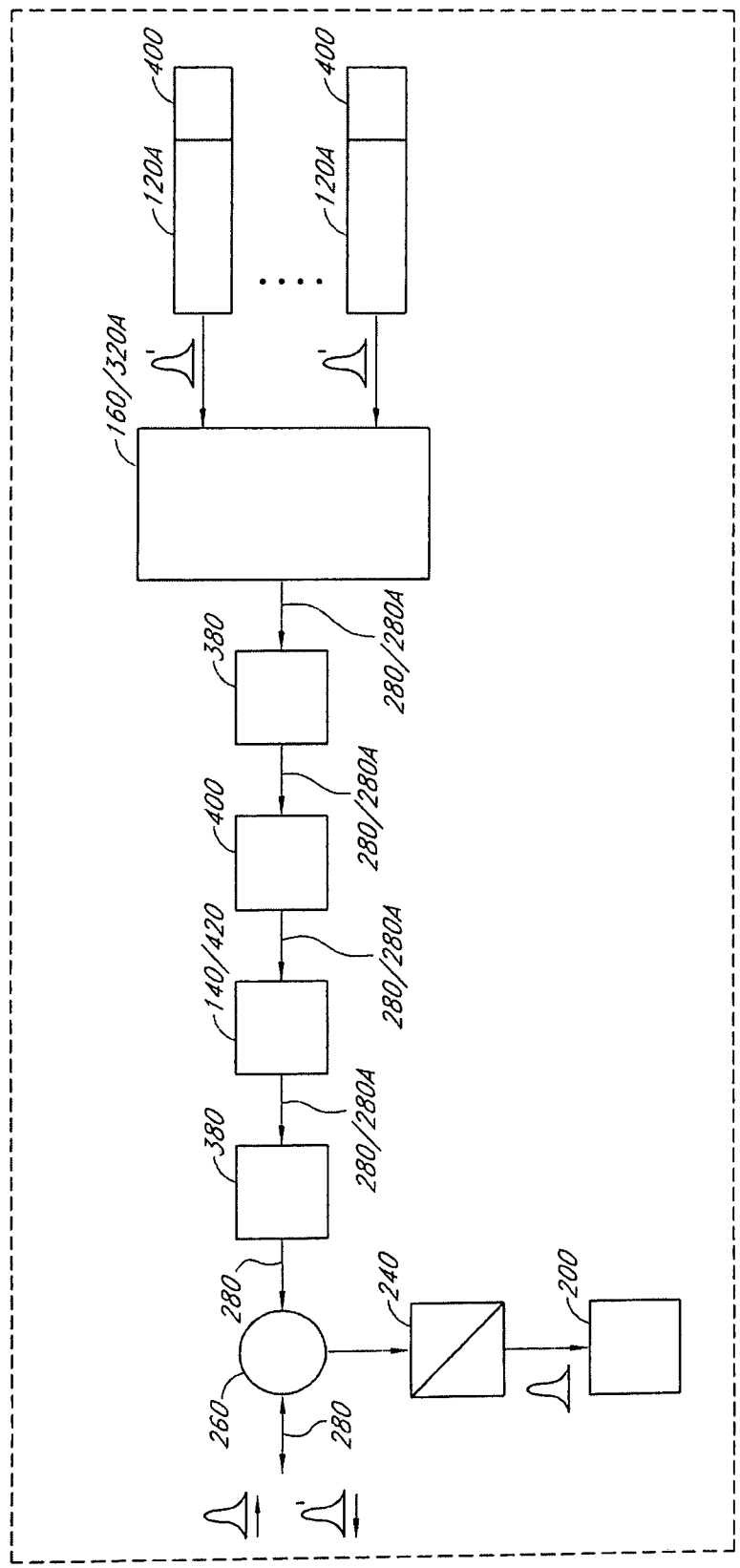
FIG. 3B illustrates a block diagram fabrication and construction of a wavelength tunable (widely) laser array module, according to another embodiment of the present invention.

FIG. 3B illustrates a block diagram fabrication and construction of a single-mode/mode-hopp free wavelength tunable (widely) laser array, which can be integrated with the wavelength combiner 160 or the Y/multi-mode interference optical power combiner 320A, the tilted/curved semiconductor optical amplifier 380, the phase modulator 400 (if needed), the intensity modulator 140/420 and the tilted/curved semiconductor optical amplifier 380 via a waveguide 280A/single-mode fiber 280. The back facet of the electro-absorption modulator segment 400 has a low anti-reflection coating, while the front facet of the last optical amplifier 380 has an ultra-low anti-reflection coating. The upstream wavelength (embedded with an optical signal) generated utilizing the tunable laser module at the intelligent subscriber subsystem 340, is passed through the 3-port circulator module 260 at the remote node 103 and transmitted to the super node 101. The downstream wavelength from the super node 101, is passed through the 3-port circulator 260, the bandpass optical filter module 240 and the photodiode module 200 at the remote node.

According to another embodiment of the present invention, a subset of a second set of wavelengths (which are offset in wavelengths with respect to a first set of wavelengths transmitted from the super node 101) can be modulated at a bit-rate (e.g., 10 Gb/s or higher Gb/s, but a variable modulation bit-rate is preferred) and thus configured to be shared with a number of intelligent subscriber subsystems 340$s$ to generate a symmetric upstream bandwidth/bandwidth on-Demand.

Both downstream and upstream wavelengths can be protected by a 2×2 optical protection switch module and separated via an optical ring-network including redundant/multiple dispersion-compensated single-mode optical fibers 280$s$.

A pilot tone modulation can be added to the semiconductor optical amplifier module 380 within the optical processing micro-subsystem 360 (within the intelligent subscriber subsystem 340) and to the laser modules 120$s$ (at the super node 101 and the local node 102) to reduce the Rayleigh backscattering effect.

An electronic dispersion compensation circuit and a forward error correction circuit can be added to relax the specifications of the optical and/or electronic modules. Furthermore, all optical single-mode fibers can be polished at an angle (about 7 degree) to reduce any optical back-reflection.

According to another embodiment of the present invention, an upstream wavelength may be shared/transmitted by a number of the intelligent subscriber subsystems 340$s$, utilizing a time division multiplexed statistical bandwidth allocation method. Therefore, a burst mode receiver circuit is needed at the super node 101 to process bursty optical signals embedded in the upstream wavelengths from a number of the intelligent subscriber subsystems 340$s$.

Furthermore, to enable higher bit-rate, a modulator/demodulator of an advanced modulation format (e.g., differential quadratic phase-shift keying-DQPSK and/or quadratic amplitude modulation-QAM) can be utilized.

Figure 4:
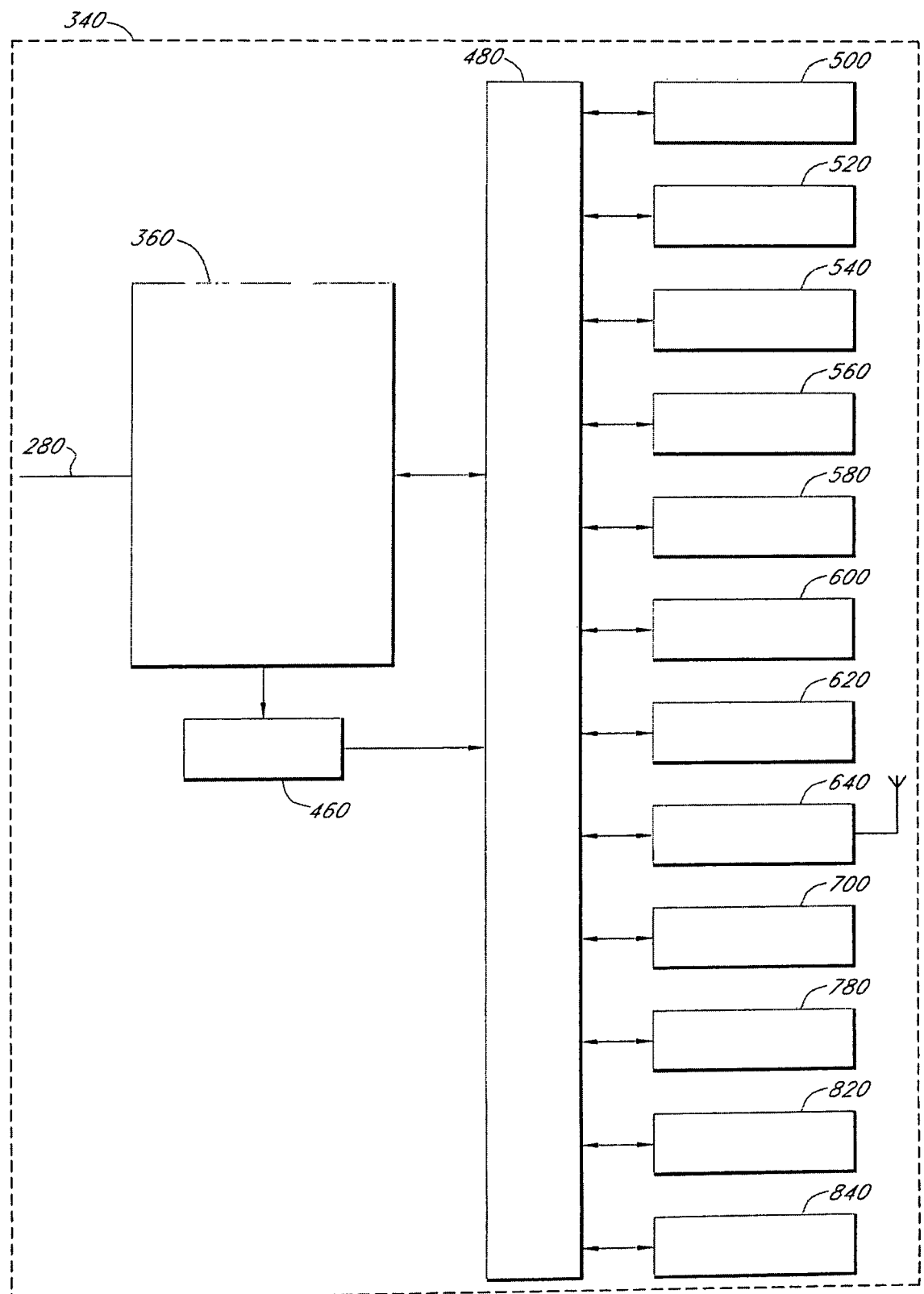
FIG. 4 illustrates a block diagram fabrication and construction of an intelligent subscriber subsystem 340, according to another embodiment of the present invention.

FIG. 4 illustrates a block diagram fabrication and construction of the intelligent subscriber subsystem 340, according to another embodiment of the present invention, wherein the intelligent subscriber subsystem 340 includes the optical processing micro-subsystem 360 (for separating and providing the downstream wavelength to the photodiode module 200 and optically processing the upstream wavelength to the super node 101). The photodiode module 200 within the optical processing micro-subsystem 360 is connected/coupled/interacted with an optical-to-electrical amplifier circuit 460 and a media access controller (with processing, routing and quality of service (QoS) functions) module and module specific software 480. The media access controller module and module specific software 480 are connected/coupled/interacted with one or more of the following: (a) an IP/micro IP/light weight IP address module and module specific software 500, (b) a security module (an internet firewall/spyware/user-specific security control/authentication) and module specific software 520, (c) an in-situ/remote diagnostic module and module specific software 540, (d) a content transfer module and module specific software 560, (e) a time-shift (time-shift is a recording of content to a storage medium for consuming at a later time) module and module specific software 580, (f) a place-shift (place-shift is consuming stored content on a remote appliance/subsystem/system/terminal via the internet) module and module specific software 600, (g) a content (voice-video-multimedia-data) over-IP module and module specific software 620, (h) a radio module (with antenna(s)), wherein the radio module includes one or more of the following modules: RFID (active/passive), Wibree, Bluetooth, Wi-Fi, Zigbee (Zigbee is an IEEE 802.15.4-based specification), ultra-wideband, 60-GHz/millimeter wave, Wi-Max/4G/higher frequency radio and an indoor/outdoor position module (e.g., Bluetooth, Wi-Fi, GPS and an electronic compass) and module specific software 640, (i) a software module 700, which includes one or more of the following: embedded/cloud based operating system software and embedded/cloud based intelligence rendering software (e.g., surveillance software, behavior modeling (e.g., www.choicestream.com), predictive analytics/text/data/pattern mining/natural language algorithm (e.g., www.sas.com), a fuzzy logic/artificial intelligence/neural network algorithm (e.g., www.nd.com/bliasoft.com), machine learning/iterative learn-by-doing/natural learning algorithm (e.g., www.saffron.com) and an intelligent agent (e.g., www.cougaarsoftware.com)), (j) a memory/storage module and module specific software 780, (k) a sensor module and module specific software 820 and (l) a battery/solar cell/micro fuel-cell/wired power supply module and module specific software 840.

Furthermore, a System-on-a-Chip (SoC), integrating a processor module and module specific software 760 with a graphic processor module, an internet firewall, spyware and the user-specific security control/authentication can simplify fabrication and construction of the intelligent subscriber subsystem 340.

The intelligent subscriber subsystem 340 includes a set top box/personal video recorder/personal server component/module. The intelligent subscriber subsystem 340 includes a voice-to-text-to-voice processing module and module specific software. (e.g., Crisp Sound is real-time audio signal processing software for echo cancellation, background noise reduction, speech enhancement and equalization), a video compression module and module specific software, a photo-editing software module and a software module for automatically uploading content to a preferred remote/cloud server.

The intelligent subscriber subsystem 340 has multiple radio modules with multiple antennas. A tunable radio-frequency carbon nanotube (CNT) cavity can tune in between 2 GHz and 3 GHz. The merger of many antennas, utilizing a tunable carbon nanotube cavity and an analog/digital converter can enable a simplified software-defined radio.

The intelligent subscriber subsystem 340 can enable content over-IP, (e.g., Skype service) thus disrupting a traditional carrier controlled fixed telephony business model.

According to another embodiment of the present invention, the secure delivery of a content optical signal to an intended destination can be achieved by utilizing a low bit-rate destination marker optical signal, which is modulated at a different plane with a different modulation format, simultaneously in conjunction with a higher-bit rate content optical signal. The low bit-rate destination marker optical signal is extracted and converted from an optical domain to an electrical domain to determine the intended destination of the content optical signal, while the content optical signal remains in an optical domain until it is delivered to the intended destination—thus both routing and security in the delivery of the content optical signal can be significantly enhanced.

Figure 5:
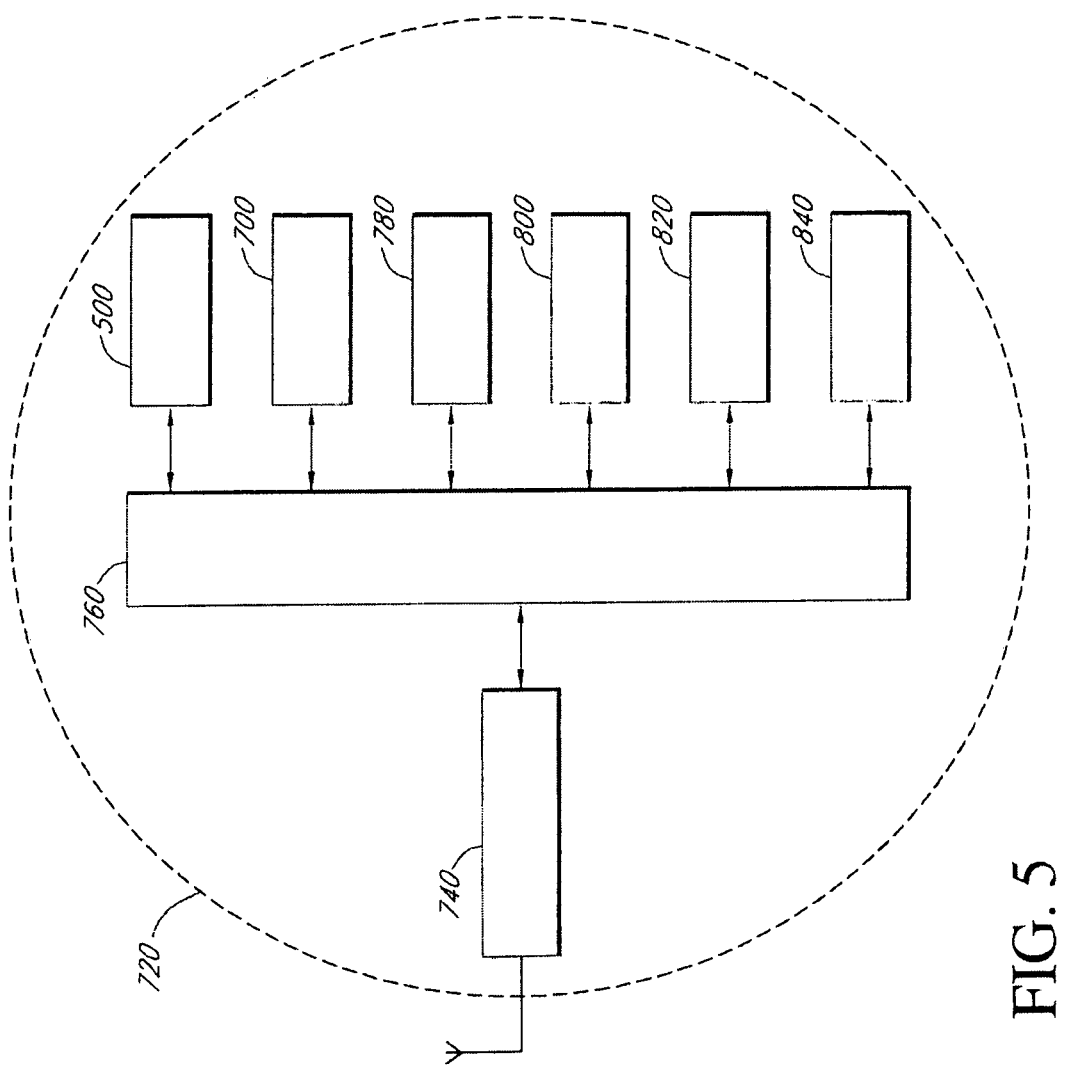
FIG. 5 illustrates a block diagram fabrication and construction of an object 720, according to another embodiment of the present invention.

FIG. 5 illustrates a block diagram fabrication and construction of a microsized (about 15 mm³) object 720, having a processor (e.g., ultra-lower power consumption ARM Cortex™-M3/microcontroller-www.ambiqmicro.com/based on nanoscaled InAs XOI) module and module specific software 760 that is connected/coupled/interacted with one or more of the following: (a) an IP/micro IP/light weight IP address module and module specific software 500, (b) a software module 700 (e.g., a Tiny OS-operating system/IBM mote runner), (c) an "object specific" radio module with antenna(s) (which includes one or more of the following: RFID (active/passive), an ultra-low power radio, Wibree, Bluetooth and near-field communication 740, (d) a memory/storage module and module specific software 780, (e) a camera module (a micro-electrical-mechanical-system based camera is preferred) and module specific software 800, (f) a sensor (e.g., a radio enabled micro-electro-mechanical sensor) module and module specific software 820 and (g) a battery/solar cell/micro fuel-cell wired power supply/wired power supply module and module specific software 840. For example, a microsized object 720 can also be realized utilizing either a conductive paint or spray-on sensor(s) on a wall. Such a wall can be an interactive surface and it may sense human touch, human gestures and interact with other sensors at a home/office.

A battery/solar cell (e.g., silicon)/micro fuel-cell/wired power supply/resonant electromagnetic inductive coupling energy transfer (wireless) power supply module and module specific software 840 can include a thick/thin film (e.g., 3.6V-12 µAh Cymbet thin-film lithium battery) printed/three-dimensional/nano-engineered battery (e.g., cellulose-a spacer ionic liquid electrolyte, electrically connected/coupled/interacted with a carbon nanotube electrode and a lithium oxide electrode), a nano supercapacitor (e.g., utilizing carbon nanotube ink or operating due to fast ion transport at a nanoscale), a nano-electrical generator of piezoelectric PZT nanowires (e.g., 20,000 n-/p-type zinc oxide nanowires can generate about 2 mW), a nano-electro-mechanical systems (NEMS) cell (e.g., a motor protein cell) and a microbial nano fuel-cell.

A motor protein (macromolecule) named prestin, which is expressed in outer hair cells in the organ of Corti of a human ear and is encoded by the SLC26A5 gene. Prestin converts an electrical voltage into a motion by elongating and contracting outer hair cells. This motion amplifies sound in a human ear. However, prestin can work in a reverse mode, producing an electrical voltage in response to a motion. To increase conductivity, a microbe (e.g., a bacterium Pili) can act as a conducting nanowire to transfer electrons generated by prestin. Each prestin cell is capable of making only nano watts of electricity. A prestin cell (array of prestins connected/coupled/interacted between two electrodes) can electrically charge a battery/micro fuel-cell/wired power supply module. A prestin cell can grow and self-heal, as it is constructed from biological components. Furthermore, a nano-electrical generator of piezoelectric PZT nanowires can be integrated with prestin.

A memristor component can replace both the processor component and/or the memory/storage component. Furthermore, a memristor component and a nano-sized radio component can reduce power consumption of the object 720.

A sensor module and module specific software 820 can include a biosensor (e.g., to monitor/measure body tempera-ture, % oxygen, heart rhythm, blood glucose concentration and a biomarker for a disease parameter).

The object 720 with a biosensor, a transistor, a light emitting diode, a nano-sized radio, a prestin cell (for electrical power) and an object specific software can be incorporated onto a support material (e.g., a silk membrane) to monitor/measure (and transmit) a disease parameter.

Another example of a biosensor sensor can be an assassin protein (macromolecule) perforin, the immune system's weapon of mass destruction. Perforin is encoded by the PRF1 gene. Perforin is expressed in T cells and natural killer (NK) cells. Interestingly, perforin resembles a cellular weapon employed by a bacterium (e.g., anthrax). Perforin has an ability to embed itself to form a pore in a cell membrane. The pore by itself may be damaging to a cell and it enables the entry of a toxic enzyme granzyme B, which induces apoptosis (a programmed suicide process) of a diseased cell. However, perforin occasionally misfires—killing the wrong cell (e.g., an insulin producing pancreas) and significantly accelerating a disease like diabetes. Defective perforin leads to an upsurge in cancer malignancy (e.g., leukemia). Up regulation of perforin can be effective against cancer and/or an acute viral disease (e.g., cerebral malaria). Down regulation of perforin can be effective against diabetes. The ramification of a pore-forming macromolecule like perforin is enormous, if it can be tailored/tuned to a specific disease.

Like perforin, ultrasonically-guided microbubbles can break into a cell membrane. A pore-forming microbubble (ultrasonically guided)/nanovessel (e.g., a cubisome/liposome) encapsulating a suitable chemical(s)/drug(s), a surface modified red fluorescent protein (e.g., E2-Crimson) and perforin (if needed) can be an effective imaging/drug delivery method. A surface coating (e.g., a pegylation) on the microbubble/nano vessel can avoid the immune surveillance of a human body. A surface coating of disease-specific ligand (e.g., an antibody) on a microbubble/nano-vessel can enhance the targeting to specific disease cells. Furthermore, an encapsulation of magnetic super-paramagnetic nanoparticles within a microbubble/nano-vessel can significantly enhance the targeting to onto specific disease cells, when it is guided by a magnet. The microbubbles/nano-vessels can be incorporated within a silicone micro catheter (coated with silver nanoparticles) tube or a micro-electrical-mechanical-system reservoir/micropump (integrated with an array of silicon microneedles) on a support material.

For utilizing the object 720 within and/or on a human body, all components must be biocompatible (bio dissolvable is preferred).

If a disease parameter measurement is perceived to be abnormal with respect to a reference disease parameter measurement, a biosensor module connects/couples/interacts with the object 720 for a programmed drug delivery. Furthermore, the object 720 can connect/couple/interact (via one/more/all the networks as listed hereinafter: electrical/optical/radio/electromagnetic/sensor/biosensor communication network(s)) with another object 720, the intelligent subscriber subsystem 340 and/or an intelligent appliance 880 for location based/assisted emergency help without human input.

The object 720 can be fabricated and constructed, utilizing a System-on-a-Chip/System-in-a-Package (SiP)/multi-chip module.

The object 720 can sense/measure/collect/aggregate/compare/map and connect/couple/interact/share (via one/more/all the networks as listed hereinafter: electrical/optical/radio/electromagnetic/sensor/biosensor communication network(s)) with another object 720), the intelligent subscriber subsystem 340 and the intelligent appliance 880, utilizing internet protocol version 6 (IPv6) and its subsequent versions.

A method of securing information by the object 720, includes at least the following steps: (a) sensing 900, (b) measuring 920, (c) collecting 940, (d) aggregating/comparing/mapping 960, (e) connecting/coupling/interacting/sharing 980 (in real-time) with the plurality of objects 720s, intelligent subscriber subsystems 340s and intelligent appliances 880s, (f) developing a learning algorithm (e.g., a machine learning/iterative learn-by-doing/natural learning algorithm in a software module 700) 1300 from the activities of the plurality of objects 720s, intelligent subscriber subsystems 340s and intelligent appliances 880s, (g) utilizing a learning algorithm 1320 and (h) re-iterating all the previous steps from (a) to (g) in a loop cycle 1340 to enable intelligent decision based on information from the plurality of objects 720s, the intelligent subscriber subsystems 340s and the intelligent appliances 880s.

Figure 6:
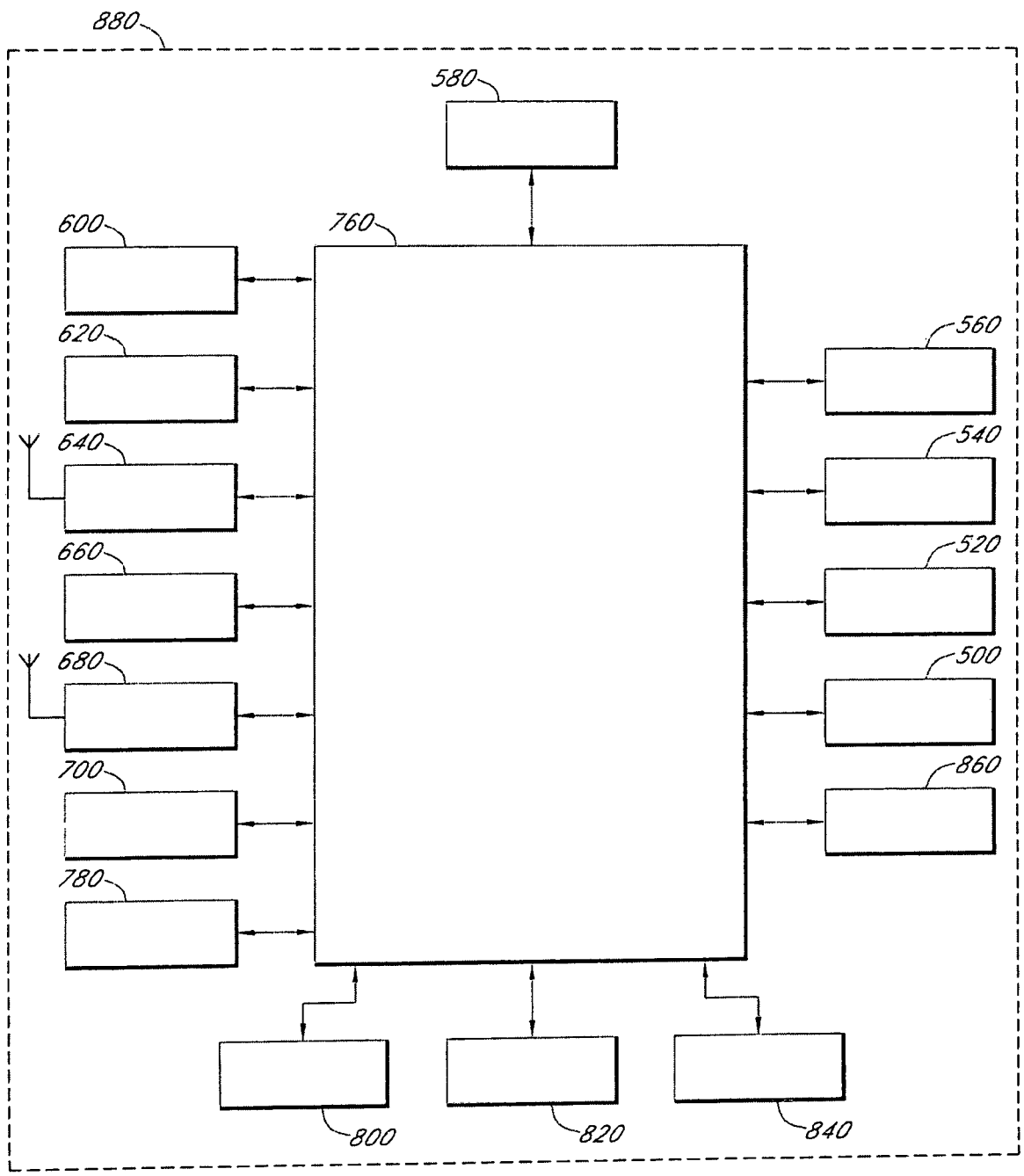
FIG. 6 illustrates a block diagram fabrication and construction of an intelligent appliance 880, according to another embodiment of the present invention.

FIG. 6 illustrates a block diagram fabrication and construction of the intelligent appliance (about 125 mm long, 75 mm wide and 20 mm thick) 880, according to another embodiment of the present invention. A processor (performance at a lower electrical power consumption is desired e.g., graphene based processor) module and module specific software 760 are connected/coupled/interacted (via one/more/all the networks as listed hereinafter: electrical/optical/radio/electromagnetic/sensor/biosensor communication network(s) with another intelligent appliance) with one or more of the following: (a) an IP/micro IP/light weight IP address module and module specific software 500, (b) a security module (an internet firewall/spyware/user-specific security control/authentication) and module specific software 520, (c) an in-situ/remote diagnostic module and module specific software 540, (d) a content transfer module and module specific software 560, (e) a time-shift module and module specific software 580, (f) a place-shift module and module specific software 600, (g) a content (voice-video-multimedia-data) over-IP module and module specific software 620, (h) a radio module (with antenna(s)), wherein the radio module includes one or more of the following modules: RFID (active/passive), Wibree, Bluetooth, Wi-Fi, ultra-wideband, 60-GHz/millimeter wave, Wi-Max/4G/higher frequency radio and an indoor/outdoor position module (e.g., Bluetooth, Wi-Fi, GPS and an electronic compass) and module specific software 640, (i) an one-dimensional/two-dimensional barcode/quick response (QR) code scanner/reader module and module specific software 660, (j) a near-field communication module (with an antenna) and module specific software 680, (k) a software module 700, which includes one or more of the following: embedded/cloud based operating system software and embedded/cloud based intelligence rendering software (e.g., surveillance software, behavior modeling (e.g., www.choicestream.com), predictive analytics/text/data/pattern mining/natural language algorithm (e.g., www.sas.com), a fuzzy logic/artificial intelligence/neural network algorithm (e.g., www.nd.com/bliasoft.com), machine learning/iterative learn-by-doing/natural learning algorithm (e.g., www.saffron.com) and an intelligent agent (e.g., www.cougaarsoftware.com)), (l) a memory/storage module and module specific software 780, (m) a camera (a 180 degree-angle rotating camera module is preferred) module and module specific software 800, (n) a sensor module and module specific software 820, (o) a battery (e.g., graphene material based battery)/solar cell/micro fuel-cell/wired power supply module and module specific software 840 and (p) a display (a foldable/stretchable display with a touch sensor or a photonic crystal or a holographic display is preferred) module and module specific software 860. An intelligent appliance 880 includes a socket (e.g., SIM/SD).

Furthermore, a camera can include a tunable focal length liquid lens. A sealed transparent (to an optical/viewing axis) optical cell can contain two immiscible (e.g., water and oil) liquids, having equal physical (not optical) densities. A pair of piezoelectric sensors/motors can be mechanically coupled (perpendicular to the optical/viewing axis) with the sealed transparent (optical cell). By applying voltage inputs to each piezoelectric sensor/motor, mechanically coupled with the sealed transparent (optical cell), the geometrical shape of one of the immiscible liquids can be changed rapidly—making a variable/tunable focal length (liquid) lens. In stead of a pair of piezoelectric sensors/motors, a pair of vanadium dioxide based piezoelectric sensors/motors can be used. Vanadium dioxide is an insulator at a room temperature, but abruptly becomes an electrical (but, not thermal) conductor at about 67° C. This temperature driven phase transition from insulator-to-metal (IMT) occurs in a time scale of milliseconds (even nanoseconds). Furthermore, vanadium dioxide (lattice) crystal also undergoes a temperature driven structural phase transition, whereby when heated the crystal rapidly contracts along one axis, while expanding along the other two axes. Thus, vanadium dioxide can enable a miniaturized piezoelectric sensor/motor. The heating of the vanadium dioxide to actuate as a miniaturized piezoelectric sensor/motor can be done with a heating pad. Furthermore, as vanadium dioxide absorbs light, it converts into heat, thus the actuation can be triggered opto-thermally.

Furthermore, a display component can include one or more embedded camera sensors (within a display pixel).

Details of the display component including one or more embedded camera sensors (within a display pixel) have been described/disclosed in FIGS. 42A and 42B of U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019.

Further details of the display component including one or more embedded camera sensors (within a display pixel) have been described/disclosed in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019 and in its related U.S. non-provisional patent applications (with all benefit provisional patent applications) are incorporated in its entirety herein with this application. Alternatively, an intelligent (smart) camera identifying an object in the intelligent (smart) camera's field of view can be utilized, where the intelligent (smart) camera can include an (embedded) digital signal processor, a tunable (short/long) focal length metasurface (e.g., utilizing thermally tunable refractive index of a phase transition/phase change material) lens and a machine learning algorithm or an artificial neural network algorithm (ANN). The intelligent (smart) camera can also include an algorithm to classify an image and another algorithm to translate language (in near real-time/real-time).

Alternatively, the camera sensor can be replaced/augmented by a computational camera sensor, wherein the computational camera sensor includes a laser and a photodiode (e.g., a PIN photodiode/avalanche photodiode (AP-D/single photon avalanche detector (SPAD)).

Details of the computational camera sensor (e.g., FIGS. 3L-3Z) have been described/disclosed in U.S. Non-Provisional patent application Ser. No. 16/602,404 entitled "SYS- TEM AND METHOD OF AMBIENT/PERVASIVE USER/ HEALTHCARE EXPERIENCE", filed on Sep. 28, 2019 and in its related U.S. non-provisional patent applications (with all benefit provisional patent applications) are incorporated in its entirety herein with this application.

Details of a holographic display component have been described/disclosed in FIG. 49 of U.S. Non-Provisional patent application Ser. No. 16/602,404 entitled "SYSTEM AND METHOD OF AMBIENT/PERVASIVE USER/ HEALTHCARE EXPERIENCE", filed on Sep. 28, 2019.

Further details of the holographic display component have been described/disclosed in U.S. Non-Provisional patent application Ser. No. 16/602,404 entitled "SYSTEM AND METHOD OF AMBIENT/PERVASIVE USER/HEALTH-CARE EXPERIENCE", filed on Sep. 28, 2019 and in its related U.S. non-provisional patent applications (with all benefit provisional patent applications) are incorporated in its entirety herein with this application.

Further details of the holographic display component have been described/disclosed in U.S. Non-Provisional patent application Ser. No. 14/999,601 entitled "SYSTEM AND METHOD OF AMBIENT/PERVASIVE USER/HEALTH-CARE EXPERIENCE", filed on Jun. 1, 2016, (which resulted in a U.S. Pat. No. 9,923,124, issued on Mar. 20, 2018) and in its related U.S. non-provisional patent applications (with all benefit provisional patent applications) are incorporated in its entirety herein with this application.

Furthermore, a System-on-a-Chip, integrating a processor module and module specific software 760 with a graphic processor module, internet firewall, spyware and the user-specific security control/authentication can simplify construction and fabrication of the intelligent appliance 880.

Furthermore, a System-on-a-Chip can be replaced by a Super System on Chip (SSoC) for fast (or ultrafast) data processing, image processing/image recognition, deep learning/meta-learning, or/and self-learning;
wherein the Super System on Chip can include:
(i) a processor-specific electronic integrated circuit (EIC), and/or
(ii) an array or a network of memristors for neural processing, and/or
(iii) a photonic component or a photonic integrated circuit (PIC), wherein the photonic component comprises an optical waveguide,
wherein the processor-specific electronic integrated circuit in said (i), the array or the network of memristors in said (ii) and the photonic component or the photonic integrated circuit in said (iii) of the Super System on Chip can be interconnected or coupled in two-dimension (2-D) or in three-dimension (3-D) electrically and/or optically. It should be noted that atomically thin metal dichalcogenide/two-dimensional semiconductor material (e.g., $MoS_2$, $WS_2$ and $WSe_2$) with semimetallic bismuth as a contact layer can enable a high performance processor-specific electronic integrated circuit, extending Moore's law.

Details of the Super System on Chip have been described/disclosed (e.g., FIGS. 15C-28B) in U.S. Non-Provisional patent application Ser. No. 16/602,404 entitled "SYSTEM AND METHOD OF AMBIENT/PERVASIVE USER/ HEALTHCARE EXPERIENCE", filed on Sep. 28, 2019 and in its related U.S. non-provisional patent applications (with all benefit provisional patent applications) are incorporated in its entirety herein with this application.

Further details of the Super System on Chip have been described/disclosed in U.S. Non-Provisional patent application Ser. No. 14/999,601 entitled "SYSTEM AND METHOD OF AMBIENT/PERVASIVE USER/HEALTH-CARE EXPERIENCE", filed on Jun. 1, 2016, (which resulted in a U.S. Pat. No. 9,923,124, issued on Mar. 20, 2018) and in its related U.S. non-provisional patent applications (with all benefit provisional patent applications) are incorporated in its entirety herein with this application.

If the Super System on Chip can be coupled with a voice processing module-enabling a neural network/machine learning based voice processing module (a Super Voice Processing Module—that can also include semantic analyzer. Powered by machine learning algorithms and natural language processing, semantic analyzer can understand the context of a natural language and/or detect emotion/sarcasm and extract valuable information from unstructured data, achieving human-level accuracy.) The Super Voice Processing Module can be used for audio events identification, command detection, keyword spotting, speaker identification and wake word detection. It can also support spoken words and can be programmed to recognize sounds.

The Super System on Chip can be coupled with a first artificial eye or a second artificial eye. The first artificial eye can include light activated and/or electrically activated switches. The second artificial eye can include an array of photodiodes/optical capacitors.

For example, the artificial eye can be fabricated/constructed utilizing a very large scale integration of the atomic scaled switches. Photocurrent is induced in a photoconductive layer (which is coupled between a metal electrode and a solid-electrolyte electrode) by light irradiation. The photocurrent reduces metal ions with positive charges in the solid-electrolyte electrode and this precipitates as metal atoms to form an atomic scaled metal connection between the metal electrode and the solid-electrolyte electrode-operating as an atomic scaled switch, turned on by light irradiation and/or an applied electrical activation (e.g., voltage).

Instead of a photoconducting layer, an array of (fast light) responsive photodiodes (e.g., made of graphene or tungsten diselenide or other suitable (fast light) responsive two-dimensional material) or an array of optical capacitors (e.g., made of p+ silicon substrate/silicon dioxide/a perovskite material with a large photoconductive response/semi-transparent metal electrode, wherein light is incident through the semi-transparent metal electrode) can be utilized also. The optical capacitor can respond dynamically to light intensities.

It should be noted that an array of (fast light) responsive photodiodes coupled with phase transition/phase change material (electrically/optically controlled) based switches can enable a fast responsive artificial eye.

Generally, a phase transition material is a solid material, wherein its lattice structure can change from a particular solid crystalline form to another solid crystalline form, still remaining crystal-graphically solid. Generally, a phase change material is a material, wherein its phase can change from (i) a solid to liquid or (ii) an amorphous to crystalline structure or (iii) crystalline structure to amorphous.

The first artificial eye or the second artificial eye can be coupled with a neural processor/Super System on Chip.

Details of the artificial eye have been described/disclosed in U.S. Non-Provisional patent application Ser. No. 16/602, 404 entitled "SYSTEM AND METHOD OF AMBIENT/ PERVASIVE USER/HEALTHCARE EXPERIENCE", filed on Sep. 28, 2019 and in its related U.S. non-provisional patent applications (with all benefit provisional patent applications) are incorporated in its entirety herein with this application.

Furthermore, the Super System on Chip can be coupled with a neuromorphic visual system.

A neuromorphic visual system including optical resistive random access memory (ORRAM) based synaptic devices in a two-dimensional array can emulate/approximate basic functions of human visual system beyond visible light.

For example, an optical resistive random access memory (ORRAM) based synaptic device can include an (i) optically (laser beam) coupled capacitor of an oxide semiconductor material (e.g., amorphous indium-gallium-zinc oxide or molybdenum oxide) or (ii) optically (laser beam) coupled field effect transistor of a two-dimensional material (e.g., molybdenum disulfide ($MoS_2$) or graphene) or a heterostructure of two distinct two-dimensional materials. An optically (laser beam) coupled capacitor of an oxide semiconductor material can be a sandwich structure of a top transparent electrode (e.g., indium tin oxide)/middle oxide semiconductor material (e.g., amorphous indium-gallium-zinc oxide or molybdenum oxide)/a bottom non-transparent electrode on a substrate.

Optically (laser beam) coupling can be realized from laser beam (propagated via an optical waveguide) diffracted by gratings etched onto an optical waveguide of an optical switch (e.g., a Mach-Zehnder interferometer type optical switch).

The optical switch (laser beam switching) can include a phase change material or a phase transition material and it can be activated by a distinct pump optical signal of another wavelength or an electrical signal (e.g., voltage or current).

To increase the intensity of laser beam, the oxide semiconductor material can be fabricated/constructed nanoscaled in size and placed near a plasmonic nanoantenna. Similarly, to increase the intensity of laser beam, a source metal and a drain metal of the field effect transistor of a two-dimensional material/heterostructure of two distinct two-dimensional materials can be fabricated/constructed to form a plasmonic nanoantenna.

Details of a plasmonic nanoantenna have been described/disclosed in FIGS. 12H-12O of U.S. Non-Provisional patent application Ser. No. 16/602,966 entitled "OPTICAL BIO-MODULE TO DETECT DISEASES AT AN EARLY ONSET", filed on Jan. 6, 2020 and in its related U.S. non-provisional patent applications (with all benefit provisional patent applications) are incorporated in its entirety herein with this application.

Thus, a neuromorphic visual system can include (i) optically (laser beam) coupled capacitor/field effect transistor, (ii) an optical switch and (iii) a plasmonic nanoantenna.

Furthermore, the Super System on Chip can be coupled with a radio (wireless) transceiver integrated circuit (e.g., 5G/higher than 5G bandwidth radio (wireless) transceiver integrated circuit).

The Super System on Chip can be coupled with an intelligent algorithm, which includes a digital security protection (DSP) algorithm submodule, a natural language processing (NLP) algorithm submodule and an application specific algorithm submodule (the application specific algorithm submodule is coupled with a public/consortium/private blockchain). The application specific algorithm submodule and a knowledge database (the knowledge database is coupled with a public/consortium/private blockchain) are coupled with a computer vision algorithm submodule, a pattern recognition algorithm submodule, a data mining algorithm submodule, Big Data analysis algorithm submodule, a statistical analysis algorithm submodule, a fuzzy logic (including neuro-fuzzy) algorithm submodule an artificial neural network/artificial intelligence algorithm submodule, a machine learning (including deep learning/meta-learning and self-learning) algorithm submodule, a predictive analysis algorithm submodule, a prescriptive algorithm module and a software agent algorithm submodule.

The fusion of a neural network algorithm and fuzzy logic algorithm is neuro-fuzzy, which can enable both learning as well as approximation of uncertainties. The neuro-fuzzy algorithm can use fuzzy inference engine (with fuzzy rules) for modeling uncertainties, which is further enhanced through learning the various situations with a radial basis function. The radial basis function consists of an input layer, a hidden layer and an output layer with an activation function of hidden units. A normalized radial basis function with unequal widths and equal heights can be written as:

$$\psi_i(x)(\text{softmax}) = \frac{\exp(h_i)}{\sum_{i=1}^{n} \exp(h_i)}$$

$$h_i = \left( -\sum_{l=1}^{2} \frac{(X_l - u_{il})^2}{2\sigma_i^2} \right)$$

X is the input vector, uil is the center of the ith hidden node (i=1, . . . , 12) that is associated with the lth (l=1, 2) input vector, σi is a common width of the ith hidden node in the layer and softmax (hi) is the output vector of the ith hidden node. The radial basis activation function is the softmax activation function. First, the input data is used to determine the centers and the widths of the basis functions for each hidden node. Second, it is a procedure to find the output layer weights that minimize a quadratic error between predicted values and target values. Mean square error can be defined as:

$$MSE = \frac{1}{N} \sum_{k=1}^{N} ((TE)_k^{exp} - (TE)_k^{cal})^2$$

The connections between various algorithm submodules of the intelligent algorithm can be similar to synaptic networks to enable deep learning/meta-learning and self-learning of the intelligent algorithm. Meta-learning can enable a machine some human-level mental agility. It may be useful for achieving machine intelligence at human-level.

Details of the intelligent algorithm have been described/disclosed in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019 and in its related U.S. non-provisional patent applications (with all benefit provisional patent applications) are incorporated in its entirety herein with this application.

Further details of the intelligent algorithm have been described/disclosed in U.S. Non-Provisional patent application Ser. No. 14/999,601 entitled "SYSTEM AND METHOD OF AMBIENT/PERVASIVE USER/HEALTHCARE EXPERIENCE", filed on Jun. 1, 2016, (which resulted in a U.S. Pat. No. 9,923,124, issued on Mar. 20, 2018) and in its related U.S. non-provisional patent applications (with all benefit provisional patent applications) are incorporated in its entirety herein with this application.

Furthermore, a super-capacitor (manufactured by www.cap-xx.com) and/or proton exchange membrane micro fuel-cell can enhance the operational time of a battery/solar cell/micro fuel-cell/wired power supply component.

A foldable/stretchable display component can be constructed from a graphene sheet and/or an organic light-emitting diode connecting/coupling/interacting with a printed organic transistor and a rubbery conductor (e.g., a mixture of carbon nanotube/gold conductor and rubbery polymer) with a touch/multi-touch sensor.

The foldable/stretchable display component can be rollable or reconfigurable/morphable in size.

Details of a foldable/stretchable/rollable display component have been described/disclosed in FIG. 14B of U.S. Non-Provisional patent application Ser. No. 14/999,601 entitled "SYSTEM AND METHOD OF AMBIENT/PERVASIVE USER/HEALTHCARE EXPERIENCE", filed on Jun. 1, 2016.

Further details of the foldable/stretchable/rollable display component have been described/disclosed in U.S. Non-Provisional patent application Ser. No. 14/999,601 entitled "SYSTEM AND METHOD OF AMBIENT/PERVASIVE USER/HEALTHCARE EXPERIENCE", filed on Jun. 1, 2016, (which resulted in a U.S. Pat. No. 9,923,124, issued on Mar. 20, 2018) and in its related U.S. non-provisional patent applications (with all benefit provisional patent applications) are incorporated in its entirety herein with this application.

Details of a display component reconfigurable/morphable in size have been described/disclosed in FIGS. 18A-18B of U.S. Non-Provisional patent application Ser. No. 16/602,966 entitled "OPTICAL BIOMODULE TO DETECT DISEASES AT AN EARLY ONSET", filed on Jan. 6, 2020.

Further details of the display component reconfigurable/morphable in size have been described/disclosed in U.S. Non-Provisional patent application Ser. No. 16/602,966 entitled "OPTICAL BIOMODULE TO DETECT DISEASES AT AN EARLY ONSET", filed on Jan. 6, 2020 and in its related U.S. non-provisional patent applications (with all benefit provisional patent applications) are incorporated in its entirety herein with this application.

The intelligent appliance 880 includes a voice-to-text-to-voice processing module and module specific software. (e.g., Crisp Sound is real-time audio signal processing software for echo cancellation, background noise reduction, speech enhancement and equalization), a video compression module and module specific software, a photo-editing software module and a software module for automatically uploading content to a preferred remote/cloud server.

The intelligent appliance 880 can be much thinner than 20 mm, if both the display and battery components are thinner.

A thinner photonic crystal display component can be fabricated and constructed as follows: optically pumping different-sized photonic crystals, whereas the photonic crystals can individually emit blue, green and red light based on their inherent sizes. Optical pumping can be generated from optical emission by electrical activation of semiconductor quantum-wells. Blue, green and red light can be then multiplexed/combined to generate white light.

Further details of the photonic crystal display component have been described/disclosed in U.S. Non-Provisional patent application Ser. No. 14/999,601 entitled "SYSTEM AND METHOD OF AMBIENT/PERVASIVE USER/HEALTHCARE EXPERIENCE", filed on Jun. 1, 2016, (which resulted in a U.S. Pat. No. 9,923,124, issued on Mar. 20, 2018) and in its related U.S. non-provisional patent applications (with all benefit provisional patent applications) are incorporated in its entirety herein with this application.

A thinner organic battery component can be fabricated and constructed as follows: an organic battery utilizes push-pull organic molecules, wherein after an electron transfer process, two positively charged molecules are formed which are repelled by each other like magnets. By installing a molecular switch, an electron transfer process can proceed in the opposite direction. Thus, forward and backward switching of an electron flow can form the basis of an ultra-thin, light weight and power efficient organic battery.

The intelligent appliance 880 can be integrated with a miniature surround sound (e.g., a micro-electrical-mechanical-system based silicon microphone component-Analog ADMP 401 or an equivalent component from www.akustica.com) module and module specific software, a miniature power efficient projection (e.g., a holographic/micromirror projector) module and module specific software, an infrared transceiver module and module specific software and a biometric sensor (e.g., a fingerprint/retinal scan) module and module specific software.

A projection module can be miniaturized by utilizing one tilt-able 1 mm diameter single crystal mirror. The mirror deflects a laser (blue, green and red) beam by rapidly switching its angle of orientation, building up a picture pixel by pixel.

An array of (at least four) front-facing cameras can provide stereo views and motion parallax (apparent difference in a direction of movement produced relative to its environment). Each camera can create a low dynamic range depth map. However, an array of cameras can create a high dynamic range depth map; thus, the intelligent appliance 880 can enable three-dimensional video conferencing.

The intelligent appliance 880 has multiple radio modules with multiple antennas. These multiple radio modules with multiple antennas can be simplified by a software-defined radio.

Augmented reality allows computer-generated content to be superimposed over a live camera-view in the real world. The intelligent appliance 880 can be integrated with augmented reality to enrich the user's experience and need.

The intelligent appliance 880 can be coupled with an augmented reality apparatus/augmented reality personal assistant apparatus.

Details of an augmented reality apparatus have been described/disclosed in FIGS. 51A, 51B, 51C, 51D, 52A, 52B, 52C, 52D and 53 in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019.

Further details of the augmented reality apparatus have been described/disclosed in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019 and in its related U.S. non-provisional patent applications (with all benefit provisional patent applications) are incorporated in its entirety herein with this application.

The augmented reality personal assistant apparatus can include a camera sensor (wherein the camera sensor can provide a two-dimensional/three-dimensional image/video, wherein the camera sensor can be electro-optically coupled with one or more microlenses to image surrounding areas) and a display component (or a holographic display component).

Furthermore, a camera sensor can include a tunable focal length liquid lens. A sealed transparent (to an optical/viewing axis) optical cell can contain two immiscible (e.g., water and oil) liquids, having equal physical (not optical) densities. A pair of piezoelectric sensors/motors can be mechanically coupled (perpendicular to the optical/viewing axis) with the sealed transparent (optical cell). By applying voltage inputs to each piezoelectric sensor/motor, mechanically coupled with the sealed transparent (optical cell), the geometrical shape of one of the immiscible liquids can be changed rapidly—making a variable/tunable focal length (liquid) lens. In stead of a pair of piezoelectric sensors/motors, a pair of vanadium dioxide based piezoelectric sensors/motors can be used. Vanadium dioxide is an insulator at a room temperature, but abruptly becomes an electrical (but, not thermal) conductor at about 67° C. This temperature driven phase transition from insulator-to-metal (IMT) occurs in a time scale of milliseconds (even nanoseconds). Furthermore, vanadium dioxide (lattice) crystal also undergoes a temperature driven structural phase transition, whereby when heated the crystal rapidly contracts along one axis, while expanding along the other two axes. Thus, vanadium dioxide can enable a miniaturized piezoelectric sensor/motor. The heating of the vanadium dioxide to actuate as a miniaturized piezoelectric sensor/motor can be done with a heating pad. Furthermore, as vanadium dioxide absorbs light, it converts into heat, thus the actuation can be triggered opto-thermally.

Alternatively, the camera sensor can be replaced/augmented by a computational camera sensor, wherein the computational camera sensor includes a laser and a photo-diode (e.g., a PIN photodiode/avalanche photodiode (APD)/single photon avalanche detector (SPAD)).

Details of the computational camera sensor (e.g., FIGS. 3L-3Z) have been described/disclosed in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019 and in its related U.S. non-provisional patent applications (with all benefit provisional patent applications) are incorporated in its entirety herein with this application.

The augmented reality personal assistant apparatus can also include a voice processing module (a module consists of one or more electronic components) to process a voice command or an audio input.

Details of an augmented reality personal assistant apparatus have been described/disclosed in FIGS. 17A-17C of U.S. Non-Provisional patent application Ser. No. 16/602,966 entitled "OPTICAL BIOMODULE TO DETECT DISEASES AT AN EARLY ONSET", filed on Jan. 6, 2020.

Further details of the augmented reality personal assistant apparatus have been described/disclosed in U.S. Non-Provisional patent application Ser. No. 16/602,966 entitled "OPTICAL BIOMODULE TO DETECT DISEASES AT AN EARLY ONSET", filed on Jan. 6, 2020 and in its related U.S. non-provisional patent applications (with all benefit provisional patent applications) are incorporated in its entirety herein with this application.

The intelligent appliance 880 can acquire information on a barcode/RFID/near-field communication tag on a product by utilizing its radio module. The intelligent appliance 880 is aware of its location via its indoor/outdoor position module (within the radio module and module specific software 640) and it can search for a price/distribution location. Thus, the intelligent appliance 880 can enable a real-world physical search.

The intelligent appliance 880 can enable content over-IP (e.g., Skype service) via an ambient Wi-Fi/Wi-Max network, thus disrupting the traditional carrier controlled cellular business model.

Near-field communication has a short range of about 35 mm-making it an ideal choice for a contact-less (proximity) application. A near-field communication module (with an antenna) and module specific software 680 can allow the user to learn/exchange/transfer/share/transact in a contactless (proximity) application in real-time. A standalone near-field communication enabled micro-subsystem (e.g., a SD/SIM card form factor) can integrate an IP/micro IP/light weight IP address module and module specific software 500, the storage/memory module and module specific software 780, the near-field communication module (with an antenna) and module specific software 680 and the software module 700. To exchange/transfer/share/transact content, the radio module and module specific software 640 can be integrated with a standalone near-field communication enabled micro subsystem. To enhance the security of the standalone near-field communication enabled micro-subsystem, the sensor module (e.g., a 0.2 mm thick fingerprint sensor component (manufactured by Seiko Epson) reads an electric current on the user's finger tip contact or a sensor component is uniquely synchronized with another sensor component) and module specific software 820 can be integrated. Furthermore, an advanced biometric (fingerprint) sensor module can be fabricated/constructed by combining a silica colloidal crystal with rubber, wherein the silica colloidal crystal can be dissolved in dilute hydrofluoric (HF) acid-leaving air voids in the rubber, thus creating an elastic photonic crystal. An elastic photonic crystal emits an intrinsic color, displaying three-dimensional shapes of ridges, valleys and pores of a fingerprint, when pressed. The processor module and module specific software 760 can be utilized to compare with the user's captured/stored fingerprint data. Non-matching fingerprint data would render the standalone near-field communication enabled micro-subsystem unusable in case of an abuse/fraud/theft.

The intelligent appliance 880 can include a sketch pad electronic module and a stylus, wherein the sketch pad electronic module include an electronic circuitry for capacitive coupling, a transparent input matrix component and a write-erase switch.

Details of the sketch pad electronic module have been described/disclosed in U.S. Non-Provisional patent application Ser. No. 13/448,378 entitled "SYSTEM AND METHOD FOR MACHINE LEARNING BASED USER APPLICATION", filed on Apr. 16, 2012 and in its related U.S. non-provisional patent applications (with all benefit provisional patent applications) are incorporated in its entirety herein with this application.

The intelligent appliance 880 can also a personal awareness assistant electronic module, wherein the personal awareness electronic module includes a microphone and/or an audio recorder The personal awareness assistant electronic module categorizes information or data received by the personal awareness assistant electronic module into a database.

Details of the personal awareness assistant electronic module have been described/disclosed in U.S. Non-Provisional patent application Ser. No. 13/448,378 entitled "SYSTEM AND METHOD FOR MACHINE LEARNING BASED USER APPLICATION", filed on Apr. 16, 2012 and in its related U.S. non-provisional patent applications (with all benefit provisional patent applications) are incorporated in its entirety herein with this application.

Five critical contactless (proximity) applications are: (a) product/service discovery/initiation, (b) peer-to-peer exchange/transfer/share/transaction, (c) machine-to-machine exchange/transfer/share/transaction, (d) remote access of an appliance/subsystem/system/terminal and (e) access authentication.

Product/Service Discovery/Initiation

The standalone near-field communication enabled micro-subsystem, in contactless proximity of another near-field communication enabled appliance/subsystem/system/terminal, receives a URL (web site) to (a) provide information about a product/service, (b) receive direct and/or peer-to-peer marketing (e.g., coupon/advertisement/promotion/brand loyalty program) and (c) monitor/measure the effectiveness of a marketing campaign.

Peer-To-Peer Exchange/transfer/Share/Transaction

The user can share social network/business profile/microloan/microcontent in contactless proximity of the near-field communication enabled appliance/subsystem/system/terminal of another user.

Machine-to-Machine Exchange/Transfer/Share/Transaction

The user can transact money/microloan/microcontent in contactless proximity of a near-field communication enabled appliance/subsystem/system/terminal.

An example, the standalone near-field communication enabled micro-subsystem can enable printing a stored photo, in contactless proximity of a near-field communication enabled printer and displaying a stored movie, in contactless proximity of a near-field communication enabled TV.

A near-field communication enabled TV can be fabricated and constructed similarly to the intelligent appliance 880.

Another example, the standalone near-field communication enabled micro-subsystem can enable purchasing a travel ticket, in contactless proximity of a near-field communication enabled ticket appliance/subsystem/system/terminal. Such a ticket can be verified and/or located by an indoor position module without need of human input.

Another example, a near-field communication enabled a printer module integrated with an electro-mechanical weighing module, an electro-mechanical postage dispensing module and a software module for calculating the postage price based on weight, distance, priority level and delivery method can enable purchasing postage efficiently.

Remote (Appliance/Subsystem/System/Terminal) Access

The user's profile, bookmarks, address book, preferences, settings, applications and contents of an appliance/subsystem/system/terminal could be stored securely in the standalone near-field communication enabled micro-subsystem, in contactless proximity of a near-field communication enabled appliance/subsystem/system/terminal, it will load an original version of the user's profile, bookmarks, address book, preferences, settings, applications and content.

Access Authentication

The user can utilize the standalone near-field communication enabled micro-subsystem, in contactless proximity of a near-field communication enabled appliance/subsystem/system/terminal to enable authentication of an appliance/subsystem/system/terminal.

The standalone near-field communication enabled micro-subsystem (as discussed above) can be integrated (by inserting into an electro-mechanical socket) with the intelligent appliance 880.

Direct marketing (e.g., coupon/advertisement/promotion/brand loyalty program) exists via AdMob and Groupon. A static social network exists via MySpace and Facebook. The primary motivation of the user is social connections with other users in a social network website. However, a web based social network can limit a human bond.

The standalone near-field communication enabled micro-subsystem/intelligent appliance can enable an off-line social exchange and direct and/or peer-to-peer marketing.

A personalized social network can utilize an augmented identity (e.g., Recognizr) in addition to a profile. A personalized social network can keep track of information/discussion/interests, which are important to the user/users and make such information/discussion/interests available to the user/users when the user/users are either on-line and/off-line.

Direct marketing can be segmented by demographics/geographical locations (e.g., gender/marital status/age/religion/interests/education/work-positionincome/credit profile/net asset/zip code). However, adding real-time geographical location to direct marketing can be useful (e.g., the user close to a stadium and minutes before an event can purchase a ticket and after an event can receive direct marketing based on the user's interests/preferences/patterns. This is personalized marketing)

Personalization can be enhanced by the intelligence rendering software module 700 (e.g., a machine learning/iterative learn-by-doing/natural learning algorithm in a software module). The intelligent software agent (a do-engine) can search the internet automatically and recommend to the user a product/service/content based on the user's interests/preferences/patterns. Integration of the user's social network profile, the user's interests/preferences/patterns, the user's real-time geographical location, data/information/images from the objects 720 and interaction (of the objects 720s with the intelligent subscriber subsystem 340 and the intelligent appliance 880) collectively can embed physical reality into internet space and internet reality into a physical space thus, it can enrich the user's experience and need.

Figure 7:
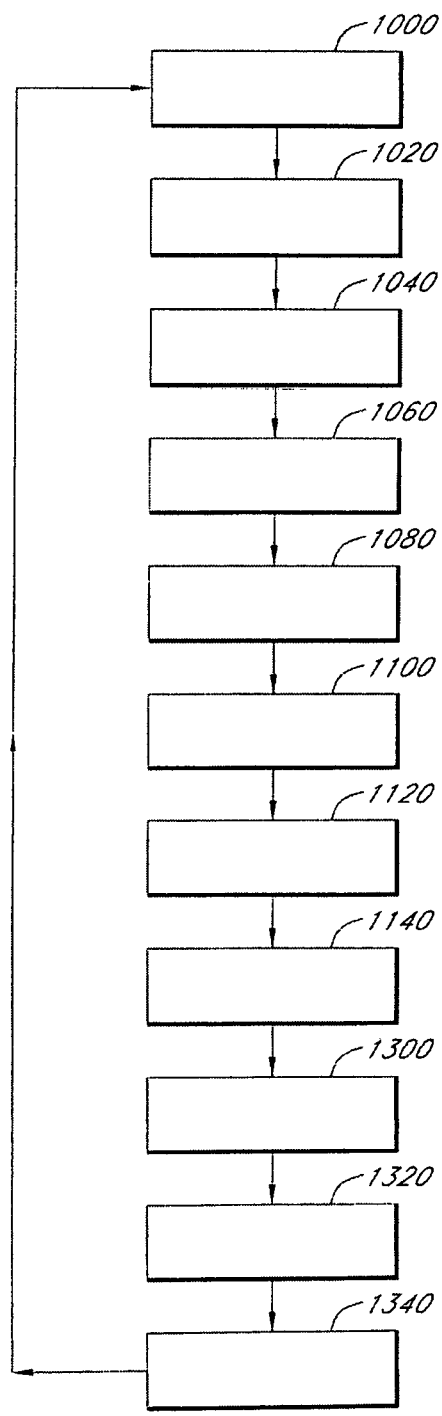
FIG. 7 illustrates a method flow-chart of an intelligent, location based and personalized social network, according to another embodiment of the present invention.

FIG. 7 illustrates a method flow-chart enabling an intelligent, location based and personalized social network, which can be realized by including at least the following steps: (a) authenticating the user 1000, (b) understanding the user's profile (an augmented identity is preferred) 1020, (c) remembering the user's need 1040, (d) remembering the user's conversation 1060, (e) reminding the user's need 1080, (f) determining the user's location (real-time is preferred) 1100, (g) searching the internet for the user's need (the intelligent software agent is preferred) 1120, (h) recommending a product/service best suited for the user's need 1140, (i) developing a learning algorithm 1300 (e.g., a machine learning/iterative learning-by-doing/natural learning algorithm in the software module 700) from a plurality of the users' activities, (j) utilizing a learning algorithm 1320 and (k) re-iterating all previous steps from (a) to (j) in a loop cycle 1340.

Figure 8:
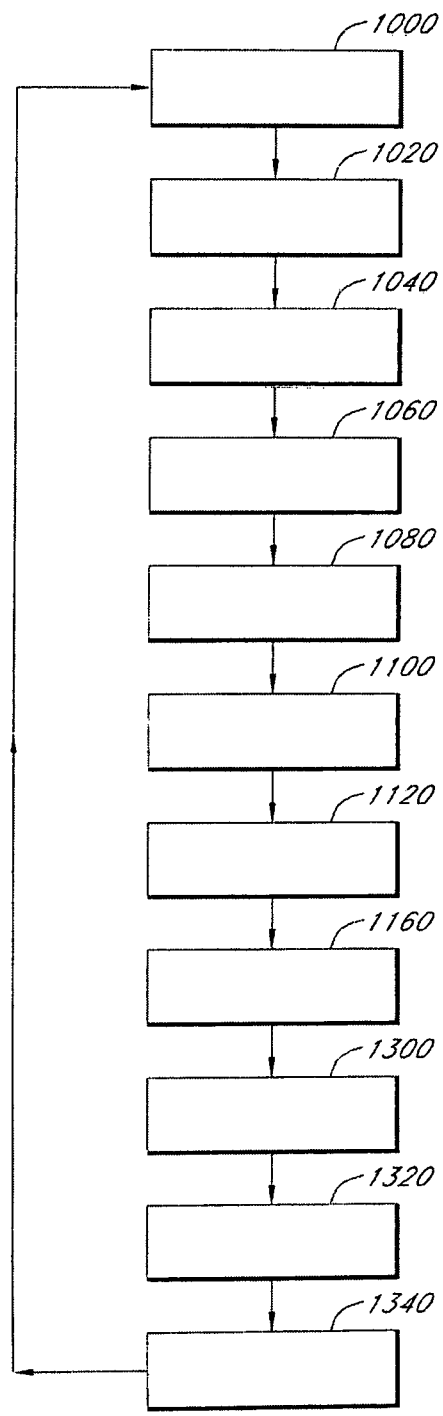
FIG. 8 illustrates a method flow-chart of intelligent, location based and personalized direct marketing, according to another embodiment of the present invention.

FIG. 8 illustrates a method flow-chart enabling intelligent, location based and personalized direct marketing (e.g., coupon/advertisement/promotion/brand loyalty program) by including at least the following steps: (a) authenticating the user 1000, (b) understanding the user's profile (an augmented identity is preferred) 1020, (c) remembering the user's need 1040, (d) remembering the user's conversation 1060, (e) reminding the user's need 1080, (f) determining the user's location (real-time is preferred) 1100, (g) searching the internet for the user's need (the intelligent software agent is preferred) 1120, (h) delivering direct marketing material (e.g., coupon/advertisement/promotion/brand loyalty program) based on the user's need 1160, (i) developing the learning algorithm 1300 (e.g., a machine learning/iterative learning-by-doing/natural learning algorithm in the software module 700) from the plurality of users' activities, (j) utilizing the learning algorithm 1320 and (k) re-iterating all previous steps from (a) to (j) in a loop cycle 1340.

A method of enabling intelligent, location based and personalized peer-to-peer marketing (e.g., coupon/advertisement/promotion/brand loyalty program) can be realized by including at least the steps: (a) authenticating the user 1000, (b) understanding the first user's profile (an augmented identity is preferred) 1020, (c) authenticating a second user 1000A, (d) understanding the second user's profile (an augmented identity is preferred) 1020A, (e) determining the first user's location (real-time is preferred) 1100, (f) determining the second user's location (real-time is preferred) 1100A, (g) communicating and/or sharing with a plurality of users for a collective need (an augmented identity is preferred) 1180, (h) determining the users' locations (real-time is preferred) 1100B, (i) delivering marketing material (e.g., coupon/advertisement/promotion/brand loyalty program) from the first user to the second user and/or users, seeking marketing material (e.g., coupon/advertisement/promotion/brand loyalty program) 1160A, (j) developing the learning algorithm 1300 (e.g., a machine learning/iterative learning-by-doing/natural learning algorithm in the software module 700) from a plurality of the users' activities, (k) utilizing the learning algorithm 1320 and (o) re-iterating all previous steps from (a) to (k) in a loop cycle 1340.

A method of enabling an intelligent, location based and personalized peer-to-peer microloan transaction can be realized by including at least the steps: (a) authenticating the user 1000, (b) understanding the first user's profile (an augmented identity is preferred) 1020, (c) authenticating a second user 1000A, (d) understanding the second user's profile (an augmented identity is preferred) 1020A, (e) determining the first user's location (real-time is preferred) 1100, (f) determining the second user's location (real-time is preferred) 1100A, (g) communicating and/or sharing with a plurality of the users for a collective need (an augmented identity is preferred) 1180, (h) determining the users' locations (real-time is preferred) 1100B, (i) determining legal parameters of a microloan 1200, (j) agreeing on legal parameters of the microloan 1220, (k) establishing a security protocol between the first user and the second user and/or users, seeking the microloan 1240, (l) delivering the microloan from the first user to the second user and/or users, seeking the microloan 1160B, (m) developing the learning algorithm 1300 (e.g., a machine learning/iterative learning-by-doing/natural learning algorithm in the software module 700) from a plurality of the users' activities, (n) utilizing the learning algorithm 1320 and (o) re-iterating all previous steps from (a) to (n) in a loop cycle 1340.

A method of enabling an intelligent, location based and personalized peer-to-peer microcontent transaction can be realized by including at least the steps: (a) authenticating the user 1000, (b) understanding the first user's profile (an augmented identity is preferred) 1020, (c) authenticating a second user 1000A, (d) understanding the second user's profile (an augmented identity is preferred) 1020A, (e) determining the first user's location (real-time is preferred) 1100, (f) determining the second user's location (real-time is preferred) 1100A, (g) communicating and/or sharing with a plurality of users for a collective need (an augmented identity is preferred) 1080, (h) determining the users' locations (real-time is preferred) 1100B, (i) determining legal parameters of microcontent transfer 1200 (j) agreeing on legal parameters of the microcontent transfer 1220, (k) establishing a security protocol between the first user and the second user and/or users, seeking the microcontent transfer 1240, (l) delivering the microcontent from the first user to the second user and/or users, seeking the microcontent 1160C, (m) developing the learning algorithm 1300 (e.g., a machine learning/iterative learning-by-doing/natural learning algorithm in the software module 700) from a plurality of the users' activities, (n) utilizing the learning algorithm 1320 and (o) re-iterating all previous steps from (a) to (n) in a loop cycle 1340.

Figure 9:
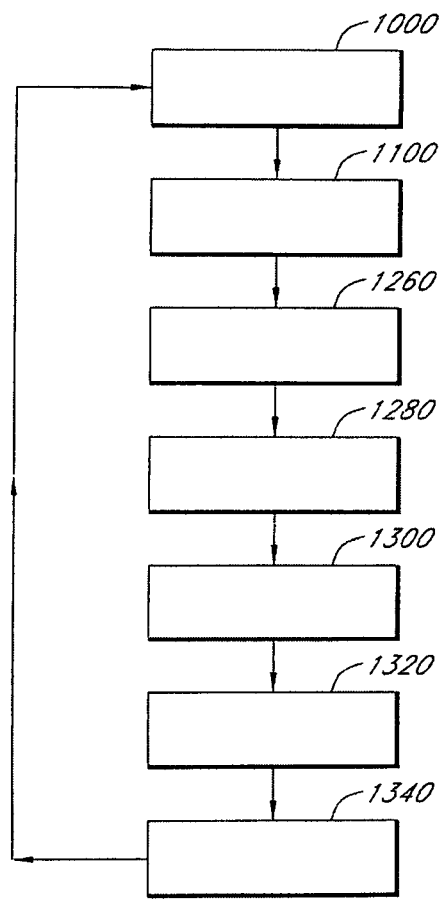
FIG. 9 illustrates a method flow-chart of intelligent, location based and personalized secure contactless (proximity) internet access authentication, according to another embodiment of the present invention.

FIG. 9 illustrates a method flow-chart enabling intelligent, location based and personalized secure contactless (proximity) internet access authentication can be realized by including at least the steps of: (a) authenticating the user 1000, (b) determining the first user's location (real-time is preferred) 1100, (b) coming in proximity of a near-field enabled appliance/subsystem/system/terminal 1260, (c) authenticating the user for the internet 1280, (d) developing the learning algorithm 1300 (e.g., a machine learning/iterative learning-by-doing/natural learning algorithm in the software module 700) from a plurality of users' activities, (e) utilizing the teaming algorithm 1320 and (f) re-iterating all previous steps from (a) to (e) in a loop cycle 1340.

An intelligent software agent can also search the internet automatically and recommend to the user a product/service/content based on the user's interests/preferences/patterns. The intelligence rendering software algorithm in the software module 700, allows the intelligent subscriber subsystem 340 and the intelligent appliance 880 to adapt/learn/relearn the user's interests/preferences/patterns, thereby rendering intelligence.

For example, a bedroom clock connects/couples/interacts with the intelligent subscriber subsystem 340 and/or the intelligent appliance 880 to automatically check on a traffic pattern/flight schedule via the internet, before deciding whether to fiddle with an alarm time without human input. When a rechargeable toothbrush detects a cavity in the teeth, it sends a signal through its electrical wiring and connects/couples/interacts with the intelligent subscriber subsystem 340 and/or the intelligent appliance 880, automatically accesses a location based/assisted dentist's electronic appointment book for a consultation without human input.

The intelligent appliance 880 can include or couple with a spatial computing system.

A spatial computing system can generally include virtual reality (VR) application, augmented reality (AR) application, mixed reality application (MR), digitized items with sensors (e.g., voice/audio control, eye tracking, hand/body tracking a camera sensor, a haptic feedback system, a LiDAR sensor for measuring distances with laser light and making three-dimensional representation in line of sight and in non-line of sight, Global Positioning System (GPS) and a geolocation sensor), real-time video, robotic system, the Internet of Things (IoT), computer implementable artificial intelligence/machine learning instructions/algorithm, computer implementable machine vision instructions/algorithm and computer implementable predictive instructions/algorithm connected via a cloud server—enabling the sensors/machines/motors to couple with each other in near real-time/real-time, thus creating an extended reality (XR) for human to machine and machine to machine interactions. For example, a digital floor plan of a house can be integrated with a digitally cataloged map of all items (including the connected sensors) in the house, as an elderly person moves through the house, the lights in the elderly person's path will automatically switch on and off, the table will move by itself to improve access to a refrigerator. The furniture will move by itself to protect the elderly person from falling, while simultaneously alerting the family member/911 emergency or an integrated monitoring station.

A spatial computing system can enable physical space to send an input request to a computer and receive an output recommendation from the computer.

The intelligent appliance 880 can integrate a chemical/biosensor module (e.g., to monitor/measure body temperature, % oxygen, heart rhythm blood glucose concentration, carbonyl sulfide gas emission due to a liver/lung disease and a biomarker for a disease parameter) with module specific software.

A zinc oxide nanostructure can detect many toxic chemicals. Also, a quantum cascade DFB/DBR/DR laser (with an emission wavelength in mid-to-far infrared range) can detect a part per billion amount of carbonyl sulfide gas. Wavelength switching of a quantum cascade DFB/DBR/DR laser can be achieved by temperature, utilizing a thin-film resistor/heater, while electrically insulating a laser bias current electrode. Wavelength switching by temperature is a slow (about ten milliseconds) thermal process. However, wavelength switching by electrical currents on multiple segments of a quantum cascade DFB/DBR/DR laser is a rapid (about one millisecond) process. A larger wavelength tuning range (nm) can be achieved by an array (a monolithic array is preferred) of multi-segment quantum cascade DFB/DBR/DR lasers. Furthermore, a quantum cascade DFB/DBR/DR laser can emit in terahertz wavelength (85 µm to 150 µm) range, where a metal has a high reflectivity. Thus, a quantum cascade DFB/DBR/DR laser is ideal for metal detection (security).

A compact biomarker-on-a-chip to monitor/measure a disease parameter can be fabricated and constructed by analyzing a change in reflectance and/or a Raman shift and/or surface electric current due to a disease-related biomarker presence (with a specific antibody at about a picogram per mL concentration) on a surface of a two-dimensional/three-dimensional photonic crystal of dielectric material. Confirmation of a single biomarker is not conclusive for the onset/presence of a disease. Identifications of many biomarkers are necessary to predict the onset/presence of a disease. However, a two-dimensional/three-dimensional photonic crystal of dielectric material, incident with a multi-wavelength (blue, green and red) light source can be utilized for simultaneous identifications of many biomarkers of a disease. A multi-wavelength (blue, green and red) light source can be fabricated and constructed as follows: optically pumping different-sized photonic crystals, whereas the photonic crystals can individually emit blue, green and red light based on their inherent sizes. Optical pumping can be generated from optical emission by electrical activation of semiconductor quantum-wells. Blue, green and red light can be multiplexed/combined to generate white light. A Raman shift scattered by the biomarker requires an expensive high-performance laser. However, a Raman sensor (requires an inexpensive CD laser and a wavelength tunable filter) can monitor/measure a Raman shift due to a disease-related biomarker presence. A biomarker molecule can induce a change in surface induced electric current when it binds to an atomically thin graphene surface (graphene's electronic sensitivity to biomolecular adsorption). Thin graphene surface may contain graphene oxide.

Alternatively, a surface-enhanced Raman spectroscopy (SERS) based Raman probe can be adopted, utilizing a substrate (e.g., a graphene/graphene oxide substrate), a miniature spectrophotometer and a laser (e.g., a 785 nm laser) to detect a presence of a disease-related biomarker.

A surface-enhanced Raman spectroscopy specific laser can be (i) a single-longitudinal mode (SLM) laser or (ii) a distributed feedback (DFB)/distributed Bragg reflection (DBR) diode laser or (iii) a volume Bragg-grating (VBG) frequency-stabilized diode laser.

A surface-enhanced Raman spectroscopy specific miniature spectrophotometer can be spectrophotometer-on-a-chip, which is based on cascaded series of arrayed waveguide grating routers (AWGR).

The substrate can have an array or a network of three-dimensional (metal) structures or three-dimensional protruded optical nanoantennas to enhance surface-enhanced Raman spectroscopy based Raman signal.

Details of a three-dimensional (metal) structure(s) have been described/disclosed in U.S. Non-Provisional patent application Ser. No. 16/602,966 entitled "OPTICAL BIOMODULE TO DETECT DISEASES AT AN EARLY ONSET", filed on Jan. 6, 2020 and in its related U.S. non-provisional patent applications (with all benefit provisional patent applications) are incorporated in its entirety herein with this application.

Details of a three-dimensional (metal) structure(s) have been described/disclosed in U.S. Non-Provisional patent application Ser. No. 15/731,577 entitled "OPTICAL BIOMODULE TO DETECT DISEASES AT AN EARLY ONSET", filed on Jul. 3, 2017 and in its related U.S. non-provisional patent applications (with all benefit provisional patent applications) are incorporated in its entirety herein with this application.

Details of a three-dimensional (metal structure(s)) have been described/disclosed in U.S. Non-Provisional patent application Ser. No. 13/663,376 entitled "OPTICAL BIOMODULE TO DETECT DISEASES", filed on Oct. 29, 2012 and in its related U.S. non-provisional patent applications (with all benefit provisional patent applications) are incorporated in its entirety herein with this application.

Examples of three-dimensional protruded optical nanoantennas have been described/disclosed in FIGS. 12H-12O3 of U.S. Non-Provisional patent application Ser. No. 16/602,906 entitled "OPTICAL BIOMODULE TO DETECT DISEASES AT AN EARLY STAGE", filed on Jan. 6, 2019.

Further details of the three-dimensional protruded optical nanoantennas have been described/disclosed in U.S. Non-Provisional patent application Ser. No. 16/602,906 entitled "OPTICAL BIOMODULE TO DETECT DISEASES AT AN EARLY STAGE", filed on Jan. 6, 2019 and in its related U.S. non-provisional patent applications (with all benefit provisional patent applications) are incorporated in its entirety herein with this application.

However, surface-enhanced Raman spectroscopy hot spot is generally less than 10 nm and a biomarker (e.g., bacteria/virus) is generally much larger in diameter than 10 nm. This size mismatch can yield poor reliability in detection of a biomarker.

A volume-enhanced Raman spectroscopy (VERS) based Raman probe signal of a biomarker can be obtained within a fluidic container, utilizing paramagnetic magnetic nanoparticles, Raman active molecules (wherein each Raman active molecule is functionalized with a biomarker selective/specific biomarker binder), a miniature spectrophotometer and a laser.

Alternatively, silver nanoparticles labeled with Raman active molecules (wherein each Raman active molecule is functionalized with a biomarker selective/specific biomarker binder) can be mixed with a biomarker. This mixture can propagate through a fluidic channel (alternatively, the fluidic channel can have an array of angled (about 70 degree angle) silver nanorods, without the need of silver nanoparticles in the first place) at the focus of a laser to generate surface-enhanced Raman spectroscopy signal by the Raman active molecules.

In general, a Raman probe can include either a surface-enhanced Raman spectroscopy based Raman probe or a volume-enhanced Raman spectroscopy (VERS) based Raman probe.

Alternative to Raman sensor/Raman probe, a Förster resonance energy transfer (FRET) based probe can be utilized, which includes a laser, a photodetector and an optical filter. Furthermore, Förster resonance energy transfer signal can be enhanced significantly in presence of one or more (or an array of) three-dimensional (metal) structures or protruded optical nanoantennas, optimized for (i) donor's absorption-emission spectrum and (ii) acceptor's absorption-emission spectrum.

Details of the Förster resonance energy transfer based probe have been described/disclosed in U.S. Non-Provisional patent application Ser. No. 16/602,966 entitled "OPTICAL BIOMODULE TO DETECT DISEASES AT AN EARLY ONSET", filed on Jan. 6, 2020 and in its related U.S. non-provisional patent applications (with all benefit provisional patent applications) are incorporated in its entirety herein with this application.

Further details of the Förster resonance energy transfer based probe (e.g., FIGS. 57I-57K) have been described/disclosed in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019 and in its related U.S. non-provisional patent applications (with all benefit provisional patent applications) are incorporated in its entirety herein with this application.

The above Raman sensor/Raman probe/Förster resonance energy transfer based probe may detect a presence of a disease-related biomarker in a virus laden pandemic.

Alternative to the above Raman sensor/Raman probe/Förster resonance energy transfer based probe, an electrochemical cell with an array of electrodes (wherein the electrochemical cell is further integrated/included with a microfluidic channel to separate plasma/serum from whole blood) can be utilized to measure electrical impedance to detect a presence of a disease-related biomarker in a virus laden pandemic.

Details of an electrochemical cell have been described/disclosed in U.S. Non-Provisional patent application Ser. No. 16/602,966 entitled "OPTICAL BIOMODULE TO DETECT DISEASES AT AN EARLY ONSET", filed on Jan. 6, 2020 and in its related U.S. non-provisional patent applications (with all benefit provisional patent applications) are incorporated in its entirety herein with this application.

The above Raman sensor/Raman probe/Förster resonance energy transfer based probe can enable location based autonomous reporting/autonomous contact tracing, when it is coupled with the intelligent appliance 880 and/or a wearable device to measure health parameters (e.g., body temperature, oxygen saturation, heart rate and blood pressure).

Details of a wearable device have been described/disclosed in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019 and in its related U.S. non-provisional patent applications (with all benefit provisional patent applications) are incorporated in its entirety herein with this application.

Furthermore, an array of graphene biosensors can detect many biomarkers of a disease thus, enabling a personalized ultra-compact diagnostic module, which can be connected/coupled/interacted with the intelligent subscriber subsystem 340 and the intelligent appliance 880.

A biological lab-on-a-chip (LOC) is a module that integrates a few bioanalytical functions on a single chip to perform point-of-care disease diagnostics. A miniature biological lab-on-a-chip module manufactured by Ostendum (www.ostendum.com) can be integrated (by inserting into an electro-mechanical cavity) with the intelligent appliance 880 to perform point-of-care disease diagnostics reliably, quickly and economically. Such a lab result can be transmitted from the intelligent appliance 880 to a location based/assisted physician for interpretation without human input. Furthermore, electrically powered by a nano-generator, zinc oxide nanowires fabricated on gallium nitride/indium gallium nitride/aluminum gallium nitride can be a nanolight source for a biological lab-on-a-chip.

The biological lab-on-a-chip can include (i) a light source (e.g., a laser of a suitable wavelength and/or (ii) a photodetector to detect a suitable wavelength and/or (iii) an optical filter to transmit/block a suitable wavelength and/or (iv) a microfluidic channel to propagate/separate/store a biological fluid (e.g., serum/plasma) containing a disease biomarker (e.g., a microRNA (miRNA)-tiny RNA is on average about 22 nucleotides long or an exosome) and a complementary disease biomarker binder (e.g., a sequence of oligonucleotides), wherein the complementary disease biomarker binder can bind/couple with the disease biomarker.

The complementary disease biomarker binder can also include one or more fluorophores. Furthermore, two fluorophores (in about 10 nm proximity) can be designed to obtain Förster resonance energy transfer (FRET).

The microfluidic channel can also include an array of three-dimensional protruded optical nanoantennas (NOAs) to enhance Förster resonance energy transfer/efficiency.

Examples of three-dimensional protruded optical nanoantennas have been described/disclosed in FIGS. 12H-12O3 of U.S. Non-Provisional patent application Ser. No. 16/602,906 entitled "OPTICAL BIOMODULE TO DETECT DISEASES AT AN EARLY STAGE", filed on Jan. 6, 2019.

Further details of the three-dimensional protruded optical nanoantennas have been described/disclosed in U.S. Non-Provisional patent application Ser. No. 16/602,906 entitled "OPTICAL BIOMODULE TO DETECT DISEASES AT AN EARLY STAGE", filed on Jan. 6, 2019 and in its related U.S. non-provisional patent applications (with all benefit provisional patent applications) are incorporated in its entirety herein with this application.

The microfluidic channel can also include a substrate of two or more materials-including, but not limited to a metamaterial (e.g. Epsilon-Near-Zero (ENZ) metamaterial) of exceptional optical properties.

Alternatively, the biological lab-on-a-chip can include a nanopore based DNA/RNA sequencing biomodule which includes a molecular system (including nucleotides-nucleotides which make up DNA utilizing adenine (A), thymine (T), cytosine (C), and guanine (G). In RNA, the thymine is replaced with uracil (U)) to be sensed, a nanohole (for passing the molecular system to be sensed) of about less than 10 nm in diameter (however, the nanohole is typically about 1.5 nm in diameter) and an electronic circuit electrically coupled with the nanohole to measure electrical signals related to the nucleotides.

The above nanopore based DNA/RNA sequencing biomodule can enable location based autonomous reporting/autonomous contact tracing, when it is coupled with the intelligent appliance 880 and/or a wearable device to measure health parameters (e.g., body temperature, oxygen saturation, heart rate and blood pressure).

Details of a nanopore based DNA/RNA sequencing biomodule have been described/disclosed in U.S. Non-Provisional patent application Ser. No. 13/663,376 entitled "OPTICAL BIOMODULE TO DETECT DISEASES", filed on Oct. 29, 2012 and in its related U.S. non-provisional patent applications (with all benefit provisional patent applications) are incorporated in its entirety herein with this application.

Holographic images of the user's genes/proteins can be stored in the intelligent appliance 880 and such holographic images can enable a physician/surgeon to design a personalized medical and/or surgical treatment.

Furthermore, the intelligent appliance 880 can store a user's encrypted heath data, coupled with a blockchain. The intelligent appliance 880 can transmit the user's encrypted heath data (coupled with a blockchain) to a medical professional (e.g., a doctor).

Details of a user's encrypted heath data, coupled with a blockchain have been described/disclosed in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019 and in its related U.S. non-provisional patent applications (with all benefit provisional patent applications) are incorporated in its entirety herein with this application.

Furthermore, the intelligent appliance 880 coupled with the biological lab-on-a-chip can be utilized for a cloud based healthcare system (e.g., telemedicine or telehealth, which is the distribution of health-related services and information over the internet without any physical presence).

An example of a cloud based healthcare system have been described/disclosed in FIGS. 3G1 & 3G2 of U.S. Non-Provisional patent application Ser. No. 16/873,634 entitled "SYSTEM AND METHOD FOR MACHINE LEARNING AND AUGMENTED REALITY BASED USER APPLICATION", filed on May 26, 2020.

Further details of the cloud based healthcare system have been described/disclosed in U.S. Non-Provisional patent application Ser. No. 16/873,634 entitled "SYSTEM AND METHOD FOR MACHINE LEARNING AND AUGMENTED REALITY BASED USER APPLICATION", filed on May 26, 2020 and in its related U.S. non-provisional patent applications (with all benefit provisional patent applications) are incorporated in its entirety herein with this application.

Many software modules, as discussed above can consume significant electrical power due to computational complexities. Alternatively, many software modules can be processed at a secure remote/cloud server. Software modules can be embedded within the intelligent subscriber subsystem 340 and/or the intelligent appliance 880, if electrical power consumption and/or thermal management are feasible. Effective thermal management is critical to fabricate and construct a high-performance intelligent appliance 880. Thermal resistance must be minimized at all material interfaces and materials with closely matching thermal expansion coefficients must be used.

Graphene can be viewed as a plane of carbon atoms extracted from a graphite crystal. Multiple-atomic layers of graphene are easier to fabricate than a single-atomic layer graphene and multiple-atomic layers of graphene retain thermal conductivity of a single-atomic layer graphene. A nanoscaled graphene heat pipe can be utilized to cool a hot spot within the intelligent appliance 880. For efficient thermal management, a heat sink/heat spreader of graphene/diamond/aluminum nitride/copper/aluminum/silicon/material with closely matching thermal expansion coefficients can be attached (e.g., to the processor module 760) by utilizing an interface heat transfer material (e.g., Indigo™ www.enerdynesolutions.com). However, a significant (about 10×) heat transfer of a heat sink/heat spreader can be gained by creating a nanostructured (e.g., zinc oxide nanostructures fabricated by microreactor assisted nanomaterial deposition process) surface on the heat sink/heat spreader. Furthermore, microchannels can be fabricated by a laser machining method onto the heat sink/heat spreader for passive air and/or active (air/liquid/micro-scale ion cloud) cooling.

A microscaled ion cloud can be generated as follows: on one side of graphene based microchannels is a carbon nanotube negative electrode, when a negative voltage is switched on, electrons jump from a negative electrode toward a positive electrode, colliding with air molecules near a hot spot thus, dissipating heat and producing a microscale cloud of positively charged ions. A microscale cloud of positively charged ions drifts towards a present negative electrode. However, before it reaches the present negative electrode, voltage is switched on to another negative electrode at a different position. Forward and reverse wind of a microscale cloud of positively charged ions (created by changing the positions of negative electrodes) can cool a hot spot within the intelligent appliance 880. Alternatively, high-efficiency nanostructured 50 A° thick $Sb_2Te_3$/10 A° thick $Bi_2Te_3$-based thin-film superlattices thermoelectric cooler (TEC)/microrefrigerator (1 mm×3 mm) can also be utilized to cool a hot spot within the intelligent appliance 880. However, significant thermoelectric cooler (TEC)/microrefrigerator efficiency can be gained by fabricating a quantum wire/quantum dot, transitioning from a two-dimensional superlattice.

Furthermore, the intelligent appliance 880 can be charged via resonant electromagnetic inductive coupling energy transfer without a physical wire.

Aluminum/magnesium alloys have small building blocks-called nanocrystal grains with crystal defects. Nanocrystal grains with crystal defects are mechanically stronger than perfect aluminum/magnesium crystals. The intelligent appliance 880's outer package can be constructed from a nano-engineered aluminum/magnesium alloy, Liquid Metal® alloy (www.liquidmetal.com), a carbon-polymer composite (carbon fiber embedded with a molten polymer injection mold) and magnesium metal. Furthermore, an antenna can be constructed from a carbon fiber embedded with a metal/conducting polymer.

Figure 10:
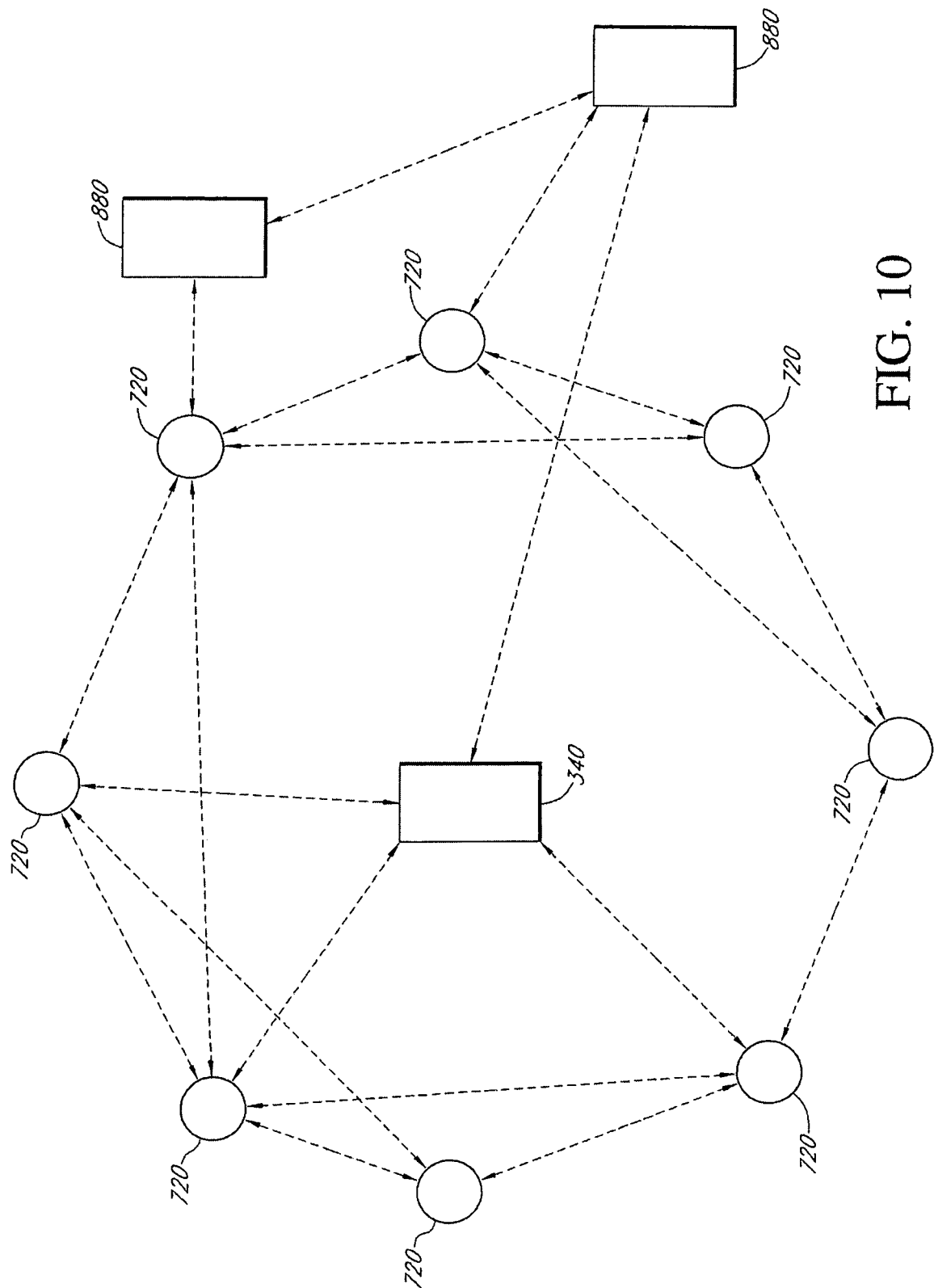
FIG. 10 illustrates connections/couplings/interactions between the object 720 (including with another object 720), the intelligent subscriber subsystem 340 and the intelligent appliance 880, according to another embodiment of the present invention.

FIG. 10 illustrates a block diagram of connections/couplings/interactions (via electrical/optical/radio/sensor/biosensor communication network(s)) between the object(s) 720 with the intelligent subscriber subsystem(s) 340 and the intelligent appliance(s) 880, utilizing internet protocol version 6 (IPv6) and its subsequent versions. The context-awareness is (according to the user's situational context), personalized (tailored to the user's need), adaptive (changes in response to the user's need) and anticipatory (can anticipate the user's desire).

The intelligent subscriber subsystem 340 and the intelligent appliance 880 are both context-aware (inferred from the user's past/present activities, extracted from the user's content/data and explicit in the user's profile) and sensor-aware (inferred from data/image/patterns from the object(s) 720). It should be noted that 5G/higher than 5G bandwidth radio (wireless) transceiver integrated circuit can be fast enough to secure data from an array of sensors without lag times. The lack of lag times can enable a user to physically interact with any remote environment (including haptic sensors). But, full sensory immersion needed for collaborative telepresence will require lag times substantially much smaller than those acceptable for video calls; however a predictive artificial intelligence (PAI) algorithm (stored in a non-transitory media of the intelligent subsystem) can be utilized to eliminate a user's perception of time lags. Thus, the intelligent subscriber subsystem 340 and/or the intelligent appliance 880 can provide collaborative telepresence, when the intelligent subscriber subsystem 340 and/or the intelligent appliance 880 is coupled with (or includes) 5G/higher than 5G bandwidth radio (wireless) transceiver and a predictive artificial intelligence algorithm to eliminate a user's perception of time lag.

Figure 11:
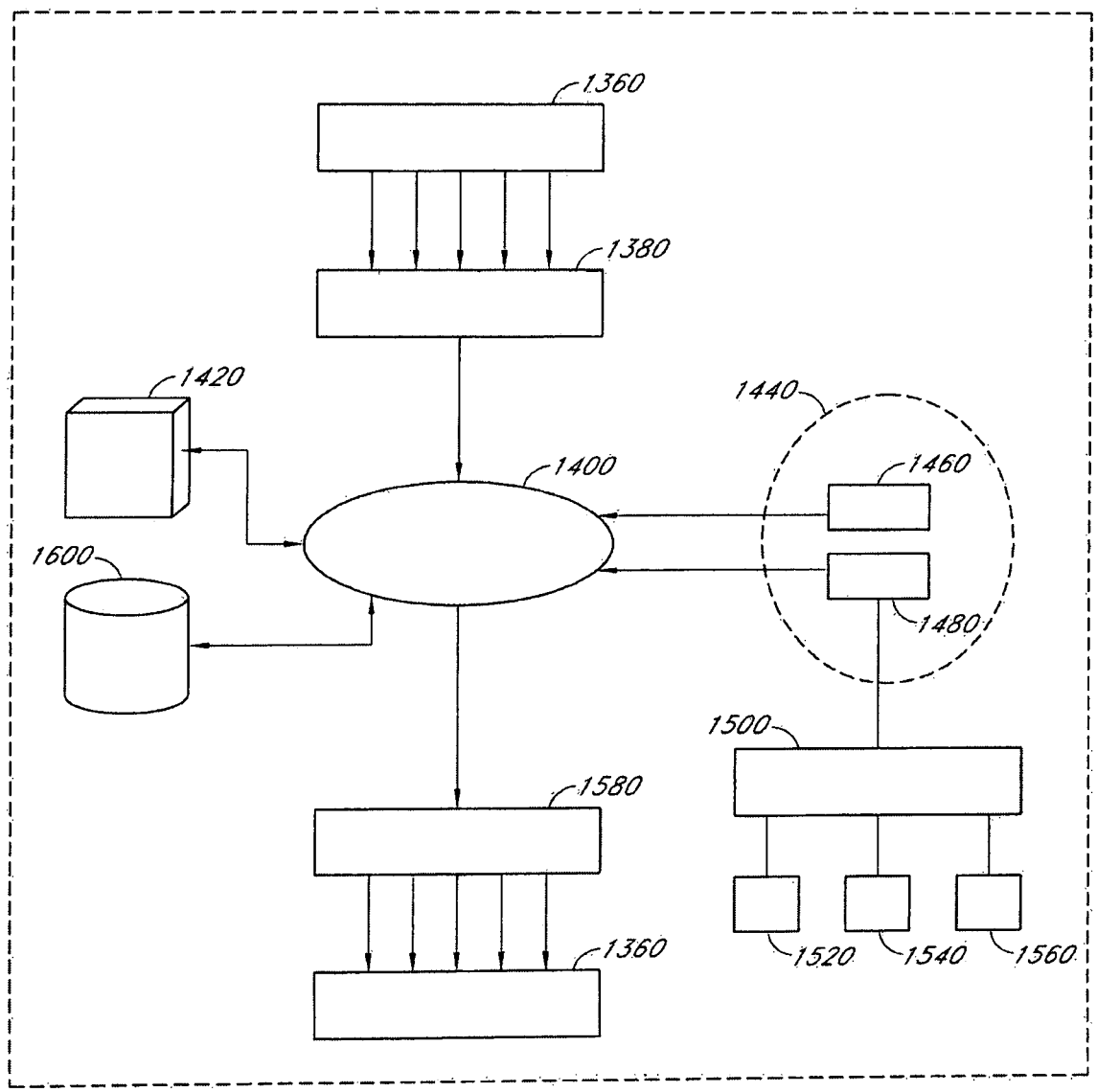
FIG. 11 illustrates a method flow-chart enabling task execution by a software agent, according to another embodiment of the present invention.

FIG. 11 illustrates a method flow-chart enabling a task execution by a software agent. An incoming task is communicated from a communication channel 1360, to an incoming queuing element 1380, to an execution manager 1400. The execution manager 1400 gains information from (and also shares with) a transient knowledge element 1420 and a data base element 1600. The execution manager 1400 further gains information from a permanent knowledge element 1440, which includes an attribute element 1460 and a capability element 1480. The capability element 1480 is connected to a task element 1500, which is further connected to a rule element 1520, a method element 1540 and a knowledge source element 1560. Executed/processed tasks from the execution manager 1400, is communicated to an outgoing queuing task controller 1580 to the communication channel 1360.

Furthermore, the intelligent appliance 880 can be coupled with an augmented reality apparatus/augmented reality personal assistant apparatus and/or augmented reality application (app).

Additionally, an augmented reality apparatus/augmented reality personal assistant apparatus can include/integrate one or more computational camera sensors for three-dimensional viewing and sensing of a surrounding area.

A computational camera sensor can generally include a laser and a photodiode, wherein the photodiode can be a PIN photodiode, an avalanche photodiode (APD) or a single photon avalanche detector (SPAD).

Details of the computational camera sensor (e.g., FIGS. 3L-3Z) have been described/disclosed in U.S. Non-Provisional patent application Ser. No. 16/602,404 entitled "SYSTEM AND METHOD OF AMBIENT/PERVASIVE USER/ HEALTHCARE EXPERIENCE", filed on Sep. 28, 2019 and in its related U.S. non-provisional patent applications (with all benefit provisional patent applications) are incorporated in its entirety herein with this application.

An augmented reality application can enable a user to share location based near real-time/real-time snapshots/holographic snapshots of the contextual world (or contextual situation) around the user—a way of viewing the world through someone else's eyes on his/her way to a place/event.

For example, the user is watching the 2016 NBA final game between the Cleveland Cavaliers v. Golden State Warriors, the user (along with his/her personalized social graph and/or social geotag of geographical data (latitude & longitude) with videos, photographs, websites, e-mails and status updates) may color enhance/edit/geofilter/geotag/personalize the near real-time/real-time snapshots/holographic snapshots of Lebron James blocking the shot of the Golden State Warriors' Andre Iguodala like "unbelievable—superman/batman performance by Lebron James" by either text input or text command in a natural language or voice command in a natural language from the intelligent appliance 880.

Furthermore, color enhanced/edited/geofiltered/geotagged/personalized holographic snapshots an individual player can enable a location based Pokémon Go like video game of an individual player.

Details of the augmented reality based application have been described/disclosed in U.S. Non-Provisional patent application Ser. No. 16/873,634 entitled "SYSTEM AND METHOD FOR MACHINE LEARNING AND AUGMENTED REALITY BASED USER APPLICATION", filed on May 26, 2020 and in its related U.S. non-provisional patent applications (with all benefit provisional patent applications) are incorporated in its entirety herein with this application.

Details of the augmented reality device/apparatus have been described/disclosed in U.S. Non-Provisional patent application Ser. No. 16/602,404 entitled "SYSTEM AND METHOD OF AMBIENT/PERVASIVE USER/HEALTHCARE EXPERIENCE", filed on Sep. 28, 2019 and in its related U.S. non-provisional patent applications (with all benefit provisional patent applications) are incorporated in its entirety herein with this application.

Details of the augmented reality personal assistant apparatus have been described/disclosed in U.S. Non-Provisional patent application Ser. No. 14/120,835 entitled "AUGMENTED REALITY PERSONAL ASSISTANT APPARATUS", filed on Jul. 1, 2014, (which resulted in a U.S. Pat. No. 9,823,737, issued on Nov. 21, 2017) and in its related U.S. non-provisional patent applications (with all benefit provisional patent applications) are incorporated in its entirety herein with this application.

Preferred Embodiments & Scope of the Invention

As used in the above disclosed specifications, the above disclosed specifications "/" has been used to indicate an "or".

As used in the above disclosed specifications and in the claims, the singular forms "a", "an", and "the" include also the plural forms, unless the context clearly dictates otherwise.

As used in the above disclosed specifications, the term "includes" means "comprises". Also the term "including" means "comprising".

As used in the above disclosed specifications, the term "couples" or "coupled" does not exclude the presence of an intermediate element(s) between the coupled items.

Any dimension in the above disclosed specifications is by way of an approximation only and not by way of any limitation.

As used in the above disclosed specifications, a hardware module/module is defined as an integration of critical electrical/optical/radio/sensor components and circuits (and algorithms, if needed) to achieve a desired property of a hardware module/module.

As used in the above disclosed specifications, a computational camera sensor is generally equivalent to a Light Detection and Ranging (LiDAR) device in meaning and in practice.

As used in the above disclosed specifications, an algorithm is defined as organized set of computer-implementable instructions to achieve a desired task.

As used in the above disclosed specifications, a software module is defined as a collection of consistent algorithms to achieve a desired task.

As used in the above disclosed specifications, real-time means near real-time in practice.

Any example in the above disclosed specifications is by way of an example only and not by way of any limitation. Having described and illustrated the principles of the disclosed technology with reference to the illustrated embodiments, it will be recognized that the illustrated embodiments can be modified in any arrangement and detail with departing from such principles. The technologies from any example can be combined in any arrangement with the technologies described in any one or more of the other examples. Alternatives specifically addressed in this application are merely exemplary and do not constitute all possible examples. Claimed invention is disclosed as one of several possibilities or as useful separately or in various combinations. See Novozymes A/S v. DuPont Nutrition Biosciences APS, 723 F3d 1336, 1347.

The best mode requirement "requires an inventor(s) to disclose the best mode contemplated by him/her, as of the time he/she executes the application, of carrying out the invention." " . . . [T]he existence of a best mode is a purely subjective matter depending upon what the inventor(s) actually believed at the time the application was filed." See Bayer AG v. Schein Pharmaceuticals. Inc. The best mode requirement still exists under the America Invents Act (AIA). At the time of the invention, the inventor(s) described preferred best mode embodiments of the present invention. The sole purpose of the best mode requirement is to restrain the inventor(s) from applying for a patent, while at the same time concealing from the public preferred embodiments of their inventions, which they have in fact conceived. The best mode inquiry focuses on the inventor(s)' state of mind at the time he/she filed the patent application, raising a subjective factual question. The specificity of disclosure required to comply with the best mode requirement must be determined by the knowledge of facts within the possession of the inventor(s) at the time of filing the patent application. See Glaxo. Inc. v. Novopharm Ltd., 52 F.3d 1043, 1050 (Fed. Cir. 1995). The above disclosed specifications are the preferred best mode embodiments of the present invention. However, they are not intended to be limited only to the preferred best mode embodiments of the present invention.

Embodiment by definition is a manner in which an invention can be made or used or practiced or expressed. "A tangible form or representation of the invention" is an embodiment.

Numerous variations and/or modifications are possible within the scope of the present invention. Accordingly, the disclosed preferred best mode embodiments are to be construed as illustrative only. Those who are skilled in the art can make various variations and/or modifications without departing from the scope and spirit of this invention. It should be apparent that features of one embodiment can be combined with one or more features of another embodiment to form a plurality of embodiments. The inventor(s) of the present invention is not required to describe each and every conceivable and possible future embodiment in the preferred best mode embodiments of the present invention. See SRI Int'l v. Matsushita Elec. Corp. of America, 775F.2d 1107, 1121, 227 U.S.P.Q. (BNA) 577, 585 (Fed. Cir. 1985)(en-banc).

The scope and spirit of this invention shall be defined by the claims and the equivalents of the claims only. The exclusive use of all variations and/or modifications within the scope of the claims is reserved. The general presumption is that claim terms should be interpreted using their plain and ordinary meaning without improperly importing a limitation from the specification into the claims. See Continental Circuits LLC v. Intel Corp. (Appeal Number 2018-1076, Fed. Cir. Feb. 8, 2019) and Oxford Immunotec Ltd. v. Oiagen. Inc. et al., Action No. 15-cv-13124-NMG. Unless a claim term is specifically defined in the preferred best mode embodiments, then a claim term has an ordinary meaning, as understood by a person with an ordinary skill in the art, at the time of the present invention. Plain claim language will not be narrowed, unless the inventor(s) of the present invention clearly and explicitly disclaims broader claim scope. See Sumitomo Dainippon Pharma Co. v. Emcure Pharm. Ltd., Case Nos. 17-1798; -1799; -1800 (Fed. Cir. Apr. 16, 2018) (Stoll, J). As noted long ago: "Specifications teach. Claims claim". See Rexnord Corp. v. Laitram Corp., 274 F.3d 1336, 1344 (Fed. Cir. 2001). The rights of claims (and rights of the equivalents of the claims) under the Doctrine of Equivalents-meeting the "Triple Identity Test" (a) performing substantially the same function, (b) in substantially the same way and (c) yielding substantially the same result. See Crown Packaging Tech., Inc. v. Rexam Beverage Can Co., 559 F.3d 1308, 1312 (Fed. Cir. 2009)) of the present invention are not narrowed or limited by the selective imports of the specifications (of the preferred embodiments of the present invention) into the claims.

While "absolute precision is unattainable" in patented claims, the definiteness requirement "mandates clarity." See Nautilus. Inc. v. Biosig Instruments. Inc., 527 U.S., 134 S. Ct. 2120, 2129, 110 USPQ2d 1688, 1693 (2014). Definiteness of claim language must be analyzed NOT in a vacuum, but in light of:

(a) The content of the particular application disclosure,
(b) The teachings of any prior art and
(c) The claim interpretation that would be given by one possessing the ordinary level of skill in the pertinent art at the time the invention was made. (Id.).

See Orthokinetics. Inc. v. Safety Travel Chairs. Inc., 806 F.2d 1565, 1 USPQ2d 1081 (Fed. Cir. 1986)

There are number of ways the written description requirement is satisfied. Applicant(s) does not need to describe every claim element exactly, because there is no such requirement (MPEP § 2163). Rather to satisfy the written description requirement, all that is required is "reasonable clarity" (MPEP § 2163.02). An adequate description may be made in any way through express, implicit or even inherent disclosures in the application, including word, structures, figures, diagrams and/or equations (MPEP §§ 2163(I), 2163.02). The set of claims in this invention generally covers a set of sufficient number of embodiments to conform to written description and enablement doctrine. See Ariad Pharm., Inc. v. Eli Lilly & Co., 598 F.3d 1336, 1355 (Fed. Cir. 2010), Regents of the University of California v. Eli Lilly & Co., 119 F.3d 1559 (Fed. Cir. 1997) & Amgen Inc. v. Chugai Pharmaceutical Co. 927 F.2d 1200 (Fed. Cir. 1991).

Furthermore, Amgen Inc. v. Chugai Pharmaceutical Co. exemplifies' Federal Circuit's strict enablement requirements. Additionally, the set of claims in this invention is intended to inform the scope of this invention with "reasonable certainty". See Interval Licensing, LLC v. AOL Inc. (Fed. Cir. Sep. 10, 2014). A key aspect of the enablement requirement is that it only requires that others will not have to perform "undue experimentation" to reproduce it. Enablement is not precluded by the necessity of some experimentation, "[t]he key word is 'undue', not experimentation." Enablement is generally considered to be the most important factor for determining the scope of claim protection allowed. The scope of enablement must be commensurate with the scope of the claims. However, enablement does not require that an inventor disclose every possible embodiment of his invention. The scope of the claims must be less than or equal to the scope of enablement. See Promega v. Life Technologies Fed. Cir., December 2014, Magsil v. Hitachi Global Storage Fed. Cir. August 2012.

The term "means" was not used nor intended nor implied in the disclosed preferred best mode embodiments of the present invention. Thus, the inventor(s) has not limited the scope of the claims as mean plus function.

An apparatus claim with functional language is not an impermissible "hybrid" claim; instead, it is simply an apparatus claim including functional limitations. Additionally, "apparatus claims are not necessarily indefinite for using functional language . . . [f]unctional language may also be employed to limit the claims without using the means-plus-function format." See National Presto Industries. Inc. v. The West Bend Co., 76 F. 3d 1185 (Fed. Cir. 1996), R.A.C.C. Indus. v. Stun-Tech. Inc., 178 F.3d 1309 (Fed. Cir. 1998) (unpublished), Miroprocessor Enhancement Corp. v. Texas Instruments Inc. & Williamson v. Citrix Online, LLC, 792 F.3d 1339 (2015).

I claim:

1. An intelligent subsystem,
    wherein the intelligent subsystem is operable with a wireless network or Zigbee,
wherein the intelligent subsystem comprises:
(a) a radio transceiver;
(b) a microphone;
(c) a voice processing module to process a voice command or an audio signal; and
    wherein the voice processing module comprises one or more first electronic components,
(d) (i) a microprocessor or (ii) a Super System on Chip (SSoC) for fast data processing, image processing/image recognition, deep learning/meta-learning or self-learning,
    wherein the Super System on Chip (SSoC) comprises (i) a processor-specific electronic integrated circuit (EIC) and (ii) an array or a network of memristors,
wherein the intelligent system is communicatively interfaced with:
(i) a first set of computer implementable instructions to process the voice command or the audio input;
    wherein the said first set of computer implementable instructions is stored in one or more cloud-based non-transitory storage media,
(ii) a second set of computer implementable instructions to understand the voice command or the audio input in a natural language; and
    wherein the said second set of computer implementable instructions is stored in the one or more cloud-based non-transitory storage media,
(iii) a third set of computer implementable instructions to provide learning or intelligence in response to a user's interest or a user's preference, that was received at the intelligent subsystem,
    wherein the said third set of computer implementable instructions comprises artificial intelligence,
    wherein the said third set of computer implementable instructions is stored in the one or more cloud-based non-transitory storage media.

2. The intelligent subsystem according to claim 1, is a user-cloud based subsystem.

3. The intelligent subsystem according to claim 1, further comprising a camera to identify an object in a field of view, wherein the camera comprises a digital signal processor (DSP).

4. The intelligent subsystem according to claim 3, wherein the camera further comprises a metasurface based lens.

5. The intelligent subsystem according to claim 4, wherein the metasurface based lens comprises a phase transition material or a phase change material.

6. The intelligent subsystem according to claim 3, wherein the camera further comprises a liquid lens.

7. The intelligent subsystem according to claim 1, further comprising a computational camera sensor for three-dimensional (3-D) sensing of a surrounding area, wherein the computational camera sensor comprises a laser and a photodiode, wherein the photodiode is selected from the group consisting of the following a PIN photodiode, an avalanche photodiode (APD) and a single photon avalanche detector (SPAD).

8. The intelligent subsystem according to claim 1, wherein the microprocessor comprises a neuromorphic visual system, wherein the neuromorphic visual system comprises (i) an array of optically coupled capacitors or (ii) an array of optically coupled field effect transistors (FETs).

9. The intelligent subsystem according to claim 1, further comprising a non-holographic display or a holographic display.

10. The intelligent subsystem according to claim 1, further comprising an electronic module selected from the group consisting of a voice over-IP module comprising one or more second electronic components, a video over-IP module comprising one or more third electronic components, a data over-IP module comprising one or more fourth electronic components and a video compression module comprising one or more fifth electronic components.

11. The intelligent subsystem according to claim 1, wherein the said third set of computer implementable instructions further comprises an artificial neural network.

12. The intelligent subsystem according to claim 1, wherein the said third set of computer implementable instructions further comprises machine learning.

13. The intelligent subsystem according to claim 1, wherein the said third set of computer implementable instructions further comprises fuzzy logic.

14. The intelligent subsystem according to claim 1, is further communicatively interfaced with a fourth set of computer implementable instructions to provide a search on an internet in response to the user's interest or the user's preference, that was received at the intelligent subsystem, wherein the said fourth set of computer implementable instructions is stored in the one or more cloud-based non-transitory storage media.

15. The intelligent subsystem according to claim 1, is further communicatively interfaced with a fifth set of computer implementable instructions to classify an image, wherein the said fifth set of computer implementable instructions is stored in the one or more cloud-based non-transitory storage media.

16. The intelligent subsystem according to claim 1, is further communicatively interfaced with a sixth set of computer implementable instructions to translate from a first language to a second language, wherein the said sixth set of computer implementable instructions is stored in the one or more cloud-based non-transitory storage media.

17. An intelligent subsystem,
    wherein the intelligent subsystem is operable with a wireless network or Zigbee,
wherein the intelligent subsystem comprises:
(a) a radio transceiver;
(b) a microphone;

(c) a voice processing module to process a voice command or an audio signal; and
    wherein the voice processing module comprises one or more first electronic components,
(d) (i) a microprocessor or (ii) a Super System on Chip (SSoC) for fast data processing, image processing/image recognition, deep learning/meta-learning or self-learning,
    wherein the Super System on Chip (SSoC) comprises (i) a processor-specific electronic integrated circuit (EIC) and (ii) an array or a network of memristors,
wherein the intelligent system is communicatively interfaced with:
(i) a first set of computer implementable instructions to process the voice command or the audio input;
    wherein the said first set of computer implementable instructions is stored in one or more cloud-based non-transitory storage media,
(ii) a second set of computer implementable instructions to understand the voice command or the audio input in a natural language; and
    wherein the said second set of computer implementable instructions is stored in the one or more cloud-based non-transitory storage media,
(iii) a third set of computer implementable instructions to provide learning or intelligence based on a user's interest or a user's preference,
    wherein the said third set of computer implementable instructions comprises artificial intelligence and fuzzy logic, wherein the said third set of computer implementable instructions is stored in the one or more cloud-based non-transitory storage media.

18. The intelligent subsystem according to claim 17, is a user-cloud based subsystem.

19. The intelligent subsystem according to claim 17, further comprising a camera to identify an object in a field of view, wherein the camera comprises a digital signal processor (DSP).

20. The intelligent subsystem according to claim 17, further comprising a computational camera sensor for three-dimensional (3-D) sensing of a surrounding area, wherein the computational camera sensor comprises a laser and a photodiode, wherein the photodiode is selected from the group consisting of the following a PIN photodiode, an avalanche photodiode (APD) and a single photon avalanche detector (SPAD).

21. The intelligent subsystem according to claim 17, wherein the microprocessor comprises a neuromorphic visual system, wherein the neuromorphic visual system comprises (i) an array of optically coupled capacitors or (ii) an array of optically coupled field effect transistors (FETs).

22. The intelligent subsystem according to claim 17, further comprising a non-holographic display or a holographic display.

23. The intelligent subsystem according to claim 17, further comprising an electronic module selected from the group consisting of a voice over-IP module comprising one or more second electronic components, a video over-IP module comprising one or more third electronic components, a data over-IP module comprising one or more fourth electronic components and a video compression module comprising one or more fifth electronic components.

24. The intelligent subsystem according to claim 17, wherein the said third set of computer implementable instructions further comprises an artificial neural network.

25. The intelligent subsystem according to claim 17, wherein the said third set of computer implementable instructions further comprises machine learning.

26. The intelligent subsystem according to claim 17, is further communicatively interfaced with a fourth set of computer implementable instructions to provide a search on an internet based on the user's interest or the user's preference, wherein the said fourth set of computer implementable instructions is stored in the one or more cloud-based non-transitory storage media.

27. The intelligent subsystem according to claim 17, is further communicatively interfaced with a fifth set of computer implementable instructions to classify an image, wherein the said fifth set of computer implementable instructions is stored in the one or more cloud-based non-transitory storage media.

28. The intelligent subsystem according to claim 17, is further communicatively interfaced with a sixth set of computer implementable instructions to translate from a first language to a second language, wherein the said sixth set of computer implementable instructions is stored in the one or more cloud-based non-transitory storage media.

29. An intelligent subsystem,
    wherein the intelligent subsystem is operable with a wireless network or Zigbee,
wherein the intelligent subsystem comprises:
(a) a radio transceiver;
(b) a microphone;
(c) a voice processing module to process a voice command or an audio signal; and
    wherein the voice processing module comprises one or more first electronic components,
(d) (i) a microprocessor or (ii) a Super System on Chip (SSoC) for fast data processing, image processing/image recognition, deep learning/meta-learning or self-learning,
    wherein the Super System on Chip (SSoC) comprises (i) a processor-specific electronic integrated circuit (EIC) and (ii) an array or a network of memristors,
wherein the intelligent system is communicatively interfaced with:
(i) a first set of computer implementable instructions to process the voice command or the audio input;
    wherein the said first set of computer implementable instructions is stored in one or more cloud-based non-transitory storage media,
(ii) a second set of computer implementable instructions to understand the voice command or the audio input in a natural language;
    wherein the said second set of computer implementable instructions is stored in the one or more cloud-based non-transitory storage media,
(iii) a third set of computer implementable instructions to provide learning or intelligence based on a user's interest or a user's preference; and
    wherein the said third set of computer implementable instructions comprises artificial intelligence,
    wherein artificial intelligence comprises machine learning,
    wherein the said third set of computer implementable instructions is stored in the one or more cloud-based non-transitory storage media,
(iv) a fourth set of computer implementable instructions to provide a search on an internet based on the user's interest or the user's preference, wherein the said fourth set of computer implementable instructions is stored in the one or more cloud-based non-transitory storage media.

30. The intelligent subsystem according to claim 29, is a user-cloud based subsystem.

31. The intelligent subsystem according to claim 29, further comprising a camera to identify an object in a field of view, wherein the camera comprises a digital signal processor (DSP).

32. The intelligent subsystem according to claim 29, further comprising a computational camera sensor for three-dimensional (3-D) sensing of a surrounding area, wherein the computational camera sensor comprises a laser and a photodiode, wherein the photodiode is selected from the group consisting of the following a PIN photodiode, an avalanche photodiode (APD) and a single photon avalanche detector (SPAD).

33. The intelligent subsystem according to claim 29, wherein the microprocessor comprises a neuromorphic visual system, wherein the neuromorphic visual system comprises (i) an array of optically coupled capacitors or (ii) an array of optically coupled field effect transistors (FETs).

34. The intelligent subsystem according to claim 29, further comprising a non-holographic display or a holographic display.

35. The intelligent subsystem according to claim 29, further comprising an electronic module selected from the group consisting of a voice over-IP module comprising one or more second electronic components, a video over-IP module comprising one or more third electronic components, a data Over-IP module comprising one or more fourth electronic components and a video compression module comprising one or more fifth electronic components.

36. The intelligent subsystem according to claim 29, wherein the said third set of computer implementable instructions further comprises an artificial neural network.

37. The intelligent subsystem according to claim 29, wherein the said third set of computer implementable instructions further comprises fuzzy logic.

38. The intelligent subsystem according to claim 29, is further communicatively interfaced with a fifth set of computer implementable instructions to classify an image, wherein the said fifth set of computer implementable instructions is stored in the one or more cloud-based non-transitory storage media.

39. The intelligent subsystem according to claim 29, is further communicatively interfaced with a sixth set of computer implementable instructions to translate from a first language to a second language, wherein the said sixth set of computer implementable instructions is stored in the one or more cloud-based non-transitory storage media.

40. An intelligent subsystem,
wherein the intelligent subsystem is operable with a wireless network or Zigbee,
wherein the intelligent subsystem comprises:
(a) a radio transceiver;
(b) a microphone;
(c) a voice processing module to process a voice command or an audio signal; and
wherein the voice processing module comprises one or more first electronic components,
(d) (i) a microprocessor or (ii) a Super System on Chip (SSoC) for fast data processing, image processing/image recognition, deep learning/meta-learning or self-learning,
wherein the Super System on Chip (SSoC) comprises (i) a processor-specific electronic integrated circuit (EIC) and (ii) an array or a network of memristors,
wherein the intelligent system is communicatively interfaced with:
(i) in a first set of computer implementable instructions to process the voice command or the audio input;
wherein the said first set of computer implementable instructions is stored in one or more cloud-based non-transitory storage media,
(ii) a second set of computer implementable instructions to understand the voice command or the audio input in a natural language; and
wherein the said second set of computer implementable instructions is stored in the one or more cloud-based non-transitory storage media,
(iii) a third set of computer implementable instructions to provide learning or intelligence based on a user's interest or a user's preference,
wherein the said third set of computer implementable instructions comprises machine learning,
wherein the said third set of computer implementable instructions is stored in the one or more cloud-based non-transitory storage media.

41. The intelligent subsystem according to claim 40, is a user-cloud based subsystem.

42. The intelligent subsystem according to claim 40, further comprising a computational camera sensor for three-dimensional (3-D) sensing of a surrounding area, wherein the computational camera sensor comprises a laser and a photodiode, wherein the photodiode is selected from the group consisting of the following a PIN photodiode, an avalanche photodiode (APD) and a single photon avalanche detector (SPAD).

43. The intelligent subsystem according to claim 40, further comprising an electronic module selected from the group consisting of a voice over-IP module comprising one or more second electronic components, a video over-IP module comprising one or more third electronic components, a data over-IP module comprising one or more fourth electronic components and a video compression module comprising one or more fifth electronic components.

44. The intelligent subsystem according to claim 40, wherein the said third set of computer implementable instructions further comprises an artificial neural network.

45. The intelligent subsystem according to claim 40, wherein the said third set of computer implementable instructions further comprises fuzzy logic.

46. The intelligent subsystem according to claim 40, is further communicatively interfaced with a fourth set of computer implementable instructions to provide a search on an internet based on the user's interest or the user's preference, wherein the said fourth set of computer implementable instructions is stored in the one or more cloud-based non-transitory storage media.

47. The intelligent subsystem according to claim 40, is further communicatively interfaced with a fifth set of computer implementable instructions to classify an image, wherein the said fifth set of computer implementable instructions is stored in the one or more cloud-based non-transitory storage media.

48. The intelligent subsystem according to claim 40, is further communicatively interfaced with a sixth set of computer implementable instructions to translate from a first language to a second language, wherein the said sixth set of computer implementable instructions is stored in the one or more cloud-based non-transitory storage media.

49. An intelligent subsystem,
wherein the intelligent subsystem is operable with a wireless network or Zigbee,
wherein the intelligent subsystem a user-cloud based subsystem, wherein the intelligent subsystem comprises:
(a) a radio transceiver;
(b) a microphone;
(c) a voice processing module to process a voice command or an audio signal; and
  wherein the voice processing module comprises one or more first electronic components,
(d) (i) a microprocessor or (ii) a Super System on Chip (SSoC) for fast data processing, image processing/image recognition, deep learning/meta-learning or self-learning,
  wherein the Super System on Chip (SSoC) comprises (i) a processor-specific electronic integrated circuit (EIC) and (ii) an array or a network of memristors,
wherein the intelligent system is communicatively interfaced with:
(i), a first set of computer implementable instructions to process the voice command or the audio input;
  wherein the said first set of computer implementable instructions is stored in one or more cloud-based non-transitory storage media,
(ii) a second set of computer implementable instructions to understand the voice command or the audio input in a natural language; and
  wherein the said second set of computer implementable instructions is stored in the one or more cloud-based non-transitory storage media,
(iii) a third set of computer implementable instructions to provide learning or intelligence based on a user's interest or a user's preference,
  wherein the said third set of computer implementable instructions comprises an artificial neural network,
  wherein the said third set of computer implementable instructions is stored in the one or more cloud-based non-transitory storage media.

50. The intelligent subsystem according to claim 49, further comprising an electronic module selected from the group consisting of a voice over-IP module comprising one or more second electronic components, a video over-IP module comprising one or more third electronic components, a data over-IP module comprising one or more fourth electronic components and a video compression module comprising one or more fifth electronic components.

51. The intelligent subsystem according to claim 49, wherein the said third set of computer implementable instructions further comprises machine learning.

52. The intelligent subsystem according to claim 49, wherein the said third set of computer implementable instructions further comprises fuzzy logic.

53. The intelligent subsystem according to claim 49, is further communicatively interfaced with a fourth set of computer implementable instructions to provide a search on an internet based on the user's interest or the user's preference, wherein the said fourth set of computer implementable instructions is stored in the one or more cloud-based non-transitory storage media.

54. An intelligent subsystem,
  wherein the intelligent subsystem is operable with a wireless network,
wherein the intelligent subsystem comprises:
(a) a radio transceiver;
(b) a microphone;
(c) a voice processing module to process an audio signal; and
  wherein the voice processing module comprises one or more first electronic components,
(d) a Super System on Chip (SSoC) for fast data processing, image processing/image recognition, deep learning/meta-learning or self-learning,
  wherein the Super System on Chip (SSoC) comprises (i) a processor-specific electronic integrated circuit (EIC) and (ii) memristors,
wherein the intelligent system is communicatively interfaced with:
(i) a first set of computer implementable instructions to process the audio signal;
  wherein the said first set of computer implementable instructions is stored in one or more cloud-based non-transitory storage media,
(ii) a second set of computer implementable instructions to understand the audio signal in a natural language;
  wherein the said second set of computer implementable instructions is stored in the one or more cloud-based non-transitory storage media,
(iii) a third set of computer implementable instructions to provide learning or intelligence in response to a user's interest, or a user's preference, that was received at the intelligent subsystem; and
  wherein the said third set of computer implementable instructions comprises artificial intelligence,
  wherein artificial intelligence comprises machine learning,
  wherein the said third set of computer implementable instructions is stored in the one or more cloud-based non-transitory storage media,
(iv) a fourth set of computer implementable instructions to provide a search on an internet in response to the user's interest or the user's preference, that was received at the intelligent subsystem,
  wherein the said fourth set of computer implementable instructions is stored in the one or more cloud-based non-transitory storage media.

55. The intelligent subsystem according to claim 54, is a user-cloud based subsystem.

56. The intelligent subsystem according to claim 54, is a cloud based subsystem.

57. The intelligent subsystem according to claim 54, wherein the audio signal comprises a voice command.

58. The intelligent subsystem according to claim 54, wherein the said third set of computer implementable instructions further comprises fuzzy logic.

59. The intelligent subsystem according to claim 54, further comprising a display.

60. An intelligent subsystem,
  wherein the intelligent subsystem is operable with a wireless network,
wherein the intelligent subsystem comprises:
(a) a radio transceiver;
(b) a microphone;
(c) a voice processing module to process an audio signal; and
  wherein the voice processing module comprises one or more first electronic components,
(d) a Super System on Chip (SSoC) for fast data processing, image processing/image recognition, deep learning/meta-learning or self-learning,
  wherein the Super System on Chip (SSoC) comprises (i) a processor-specific electronic integrated circuit (EIC) and (ii) memristors,
wherein the intelligent system is communicatively interfaced with:
(i) a first set of computer implementable instructions to process the audio signal;

wherein the said first set of computer implementable instructions is stored in one or more cloud-based non-transitory storage media, (ii) a second set of computer implementable instructions to understand the audio signal in a natural language;
wherein the said second set of computer implementable instructions is stored in the one or more cloud-based non-transitory storage media, (iii) a third set of computer implementable instructions to provide learning or intelligence in response to a user's interest, or a user's preference, that was received at the intelligent subsystem; and
wherein the said third set of computer implementable instructions comprises artificial intelligence,
wherein artificial intelligence comprises machine learning,
wherein the said third set of computer implementable instructions is stored in the one or more cloud-based non-transitory storage media, (iv) a fourth set of computer implementable instructions to provide an automatic search on an internet in response to the user's interest or the user's preference, that was received at the intelligent subsystem,
wherein the said fourth set of computer implementable instructions is stored in the one or more cloud-based non-transitory storage media.

61. The intelligent subsystem according to claim 60, is a user-cloud based subsystem.

62. The intelligent subsystem according to claim 60, is a cloud based subsystem.

63. The intelligent subsystem according to claim 60, wherein the audio signal comprises a voice command.

64. The intelligent subsystem according to claim 60, wherein the said third set of computer implementable instructions further comprises fuzzy logic.

65. The intelligent subsystem according to claim 60, further comprising a display.

66. An intelligent subsystem,
wherein the intelligent subsystem is operable with a wireless network,
wherein the intelligent subsystem comprises:
(a) a radio transceiver;
(b) a microphone;
(c) a voice processing module to process an audio signal; and
wherein the voice processing module comprises one or more first electronic components,
(d) a microprocessor,
wherein the intelligent system is communicatively interfaced with:
(i) a first set of computer implementable instructions to process the audio signal;
wherein the said first set of computer implementable instructions is stored in one or more cloud-based non-transitory storage media,
(ii) a second set of computer implementable instructions to understand the audio signal in a natural language;
wherein the said second set of computer implementable instructions is stored in the one or more cloud-based non-transitory storage media,
(iii) a third set of computer implementable instructions to provide learning or intelligence in response to a user's interest, or a user's preference, that was received at the intelligent subsystem; and
wherein the said third set of computer implementable instructions comprises artificial intelligence,
wherein artificial intelligence comprises an artificial neural network,
wherein the said third set of computer implementable instructions is stored in the one or more cloud-based non-transitory storage media,
(iv) a fourth set of computer implementable instructions to provide a search on an internet in response to the user's interest, or the user's preference, that was received at the intelligent subsystem, wherein the said fourth set of computer implementable instructions is stored in the one or more cloud-based non-transitory storage media.

67. The intelligent subsystem according to claim 66, is a user-cloud based subsystem.

68. The intelligent subsystem according to claim 66, is a cloud based subsystem.

69. The intelligent subsystem according to claim 66, wherein the audio signal comprises a voice command.

70. The intelligent subsystem according to claim 66, further comprising a display.

71. An intelligent subsystem,
wherein the intelligent subsystem is operable with a wireless network,
wherein the intelligent subsystem comprises:
(a) a radio transceiver;
(b) a microphone;
(c) a voice processing module to process an audio signal; and
wherein the voice processing module comprises one or more first electronic components,
(d) a microprocessor,
wherein the intelligent system is communicatively interfaced with:
(i) a first set of computer implementable instructions to process the audio signal;
wherein the said first set of computer implementable instructions is stored in one or more cloud-based non-transitory storage media,
(ii) a second set of computer implementable instructions to understand the audio signal in a natural language;
wherein the said second set of computer implementable instructions is stored in the one or more cloud-based non-transitory storage media,
(iii) a third set of computer implementable instructions to provide learning or intelligence in response to a user's interest, or a user's preference, that was received at the intelligent subsystem; and
wherein the said third set of computer implementable instructions comprises artificial intelligence,
wherein artificial intelligence comprises an artificial neural network,
wherein the said third set of computer implementable instructions is stored in the one or more cloud-based non-transitory storage media,
(iv) a fourth set of computer implementable instructions to provide an automatic search on an internet in response to the user's interest, or the user's preference, that was received at the intelligent subsystem, wherein the said fourth set of computer implementable instructions is stored in the one or more cloud-based non-transitory storage media.

72. The intelligent subsystem according to claim 71, is a user-cloud based subsystem.

73. The intelligent subsystem according to claim 71, is a cloud based subsystem.

74. The intelligent subsystem according to claim 71, wherein the audio signal comprises a voice command.

75. The intelligent subsystem according to claim 71, further comprising a display.

76. An intelligent subsystem,
wherein the intelligent subsystem is operable with a wireless network,
wherein the intelligent subsystem comprises:
(a) a radio transceiver;
(b) a microphone;
(c) a voice processing module to process an audio signal; and
  wherein the voice processing module comprises one or more first electronic components,
(d) a microprocessor,
wherein the intelligent system is communicatively interfaced with:
(i) a first set of computer implementable instructions to process the audio signal;
  wherein the said first set of computer implementable instructions is stored in one or more cloud-based non-transitory storage media,
(ii) a second set of computer implementable instructions to understand the audio signal in a natural language;
  wherein the said second set of computer implementable instructions is stored in the one or more cloud-based non-transitory storage media,
(iii) a third set of computer implementable instructions to provide learning or intelligence in response to a user's interest, or a user's preference, that was received at the intelligent subsystem; and
  wherein the said third set of computer implementable instructions comprises artificial intelligence and fuzzy logic,
  wherein the said third set of computer implementable instructions is stored in the one or more cloud-based non-transitory storage media,
(iv) a fourth set of computer implementable instructions to provide a search on an internet in response to the user's interest, or the user's preference, that was received at the intelligent subsystem, wherein the said fourth set of computer implementable instructions is stored in the one or more cloud-based non-transitory storage media.

77. An intelligent subsystem,
wherein the intelligent subsystem is operable with a wireless network,
wherein the intelligent subsystem comprises:
(a) a radio transceiver;
(b) a microphone;
(c) a voice processing module to process an audio signal; and
  wherein the voice processing module comprises one or more first electronic components,
(d) a microprocessor,
wherein the intelligent system is communicatively interfaced with:
(i) a first set of computer implementable instructions to process the audio signal;
  wherein the said first set of computer implementable instructions is stored in one or more cloud-based non-transitory storage media,
(ii) a second set of computer implementable instructions to understand the audio signal in a natural language;
  wherein the said second set of computer implementable instructions is stored in the one or more cloud-based non-transitory storage media,
(iii) a third set of computer implementable instructions to provide learning or intelligence in response to a user's interest, or a user's preference, that was received at the intelligent subsystem; and
  wherein the said third set of computer implementable instructions comprises artificial intelligence and fuzzy logic,
  wherein the said third set of computer implementable instructions is stored in the one or more cloud-based non-transitory storage media,
(iv) a fourth set of computer implementable instructions to provide an automatic search on an internet in response to the user's interest, or the user's preference, that was received at the intelligent subsystem, wherein the said fourth set of computer implementable instructions is stored in the one or more cloud-based non-transitory storage media.

\* \* \* \* \*

UNITED STATES PATENT AND TRADEMARK OFFICE
CERTIFICATE OF CORRECTION

| | |
|---|---|
| PATENT NO. | : 11,843,903 B2 |
| APPLICATION NO. | : 17/300394 |
| DATED | : December 12, 2023 |
| INVENTOR(S) | : Mohammad A. Mazed |

It is certified that error appears in the above-identified patent and that said Letters Patent is hereby corrected as shown below:

In the Claims

In Claim 1, Column 39, Line 40:
Please delete "intelligent system"
And insert --intelligent subsystem--

In Claim 2, Column 39, Line 63:
Please delete "user-cloud"
And insert --user cloud--

In Claim 7, Column 40, Line 14:
Please delete "following"
And insert --following:--

In Claim 17, Column 41, Line 11:
Please delete "intelligent system"
And insert --intelligent subsystem--

In Claim 18, Column 41, Line 33:
Please delete "user-cloud"
And insert --user cloud--

In Claim 20, Column 41, Line 43:
Please delete "following"
And insert --following:--

In Claim 29, Column 42, Line 38:
Please delete "intelligent system"
And insert --intelligent subsystem--

Signed and Sealed this
Third Day of September, 2024

Katherine Kelly Vidal
*Director of the United States Patent and Trademark Office*

CERTIFICATE OF CORRECTION (continued)
U.S. Pat. No. 11,843,903 B2

In Claim 30, Column 42, Line 67:
Please delete "user-cloud"
And insert --user cloud--

In Claim 32, Column 43, Line 10:
Please delete "following"
And insert --following:--

In Claim 35, Column 43, Line 26:
Please delete "Over-IP"
And insert --over-IP--

In Claim 40, Column 43, Line 64:
Please delete "intelligent system"
And insert --intelligent subsystem--

In Claim 41, Column 44, Line 19:
Please delete "user-cloud"
And insert --user cloud--

In Claim 42, Column 44, Line 25:
Please delete "following"
And insert --following:--

In Claim 49, Column 44, Line 66:
Please delete "a user-cloud based"
And insert --is a user cloud based--

In Claim 49, Column 45, Line 14:
Please delete "intelligent system"
And insert --intelligent subsystem--

In Claim 49, Column 45, Line 16:
Please delete "(i), a first"
And insert --(i) a first--

In Claim 54, Column 46, Line 7:
Please delete "intelligent system"
And insert --intelligent subsystem--

In Claim 55, Column 46, Line 38:
Please delete "user-cloud"
And insert --user cloud--

CERTIFICATE OF CORRECTION (continued)
U.S. Pat. No. 11,843,903 B2

In Claim 60, Column 46, Line 64:
Please delete "intelligent system"
And insert --intelligent subsystem--

In Claim 61, Column 47, Line 29:
Please delete "user-cloud"
And insert --user cloud--

In Claim 66, Column 47, Line 50:
Please delete "intelligent system"
And insert --intelligent subsystem--

In Claim 67, Column 48, Line 13:
Please delete "user-cloud"
And insert --user cloud--

In Claim 71, Column 48, Line 31:
Please delete "intelligent system"
And insert --intelligent subsystem--

In Claim 72, Column 48, Line 61:
Please delete "user-cloud"
And insert --user cloud--

In Claim 76, Column 49, Line 12:
Please delete "intelligent system"
And insert --intelligent subsystem--

In Claim 77, Column 50, Line 12:
Please delete "intelligent system"
And insert --intelligent subsystem--